(12) United States Patent
You

(10) Patent No.: US 7,545,097 B2
(45) Date of Patent: Jun. 9, 2009

(54) ORGANIC ELECTROLUMINESCENCE DEVICE AND METHOD FOR MANUFACTURING SAME

(75) Inventor: Jae Houn You, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 362 days.

(21) Appl. No.: 11/494,557

(22) Filed: Jul. 28, 2006

(65) Prior Publication Data

US 2007/0236142 A1 Oct. 11, 2007

(30) Foreign Application Priority Data

Apr. 5, 2006 (KR) ...................... 10-2006-0031163

(51) Int. Cl.
*H01J 1/62* (2006.01)
(52) U.S. Cl. ...................................... 313/506; 313/504
(58) Field of Classification Search ................. 313/498, 313/504, 506
See application file for complete search history.

(56) References Cited

U.S. PATENT DOCUMENTS

2004/0048543 A1 3/2004 Kanno et al.

2005/0157367 A1 7/2005 Miyazawa

FOREIGN PATENT DOCUMENTS

| EP | 1 492 387 | 12/2004 |
|---|---|---|
| JP | 2000243558 | 9/2000 |
| KR | 1020030081968 A | 10/2003 |
| KR | 1020050014379 A | 2/2005 |

*Primary Examiner*—Vip Patel
(74) *Attorney, Agent, or Firm*—Bacon & Thomas, PLLC

(57) ABSTRACT

An organic electroluminescence device includes a substrate; first electrodes arranged on the luminous portion of the substrate in a single direction; an insulating layer pattern formed on the first electrodes and the substrate in a lattice shape to define plural pixel openings on the first electrodes; partition layers formed on the insulating layer pattern, the partition layers intersecting the first electrodes perpendicularly; organic thin film layer formed on the pixel openings; second electrodes formed on the organic thin film layer to be perpendicular to the first electrodes; first bus electrode patterns formed on the pad portion of the substrate to be connected with the first electrodes; second bus electrode patterns formed on the pad portion of the substrate to be connected with the second electrodes and including a material for forming the second electrodes; and barrier films formed between the second bus electrode patterns.

8 Claims, 24 Drawing Sheets

ORGANIC ELECTROLUMINESCENCE DEVICE AND METHOD FOR MANUFACTURING SAME

FIELD OF THE INVENTION

The present invention relates to an organic electroluminescence device; and, more particularly, to an organic electroluminescence device capable of reducing a resistance of a bus electrode pattern, and a method for manufacturing same.

BACKGROUND OF THE INVENTION

In general, an organic electroluminescence device (OLED) is one of flat plate display devices, and it is formed by interposing an organic thin film between an anode layer and a cathode layer on a wafer. The OLED is of a very thin matrix shape.

The OLED has many advantages in that it can be operated at a very low voltage and it is very thin. Thus, the OLED can solve the drawbacks of a conventional LCD including a narrow optical viewing angle, a low response speed, etc. In comparison with other types of displays, in particular, those of middles sizes, the OLED can provide the same image quality as that of, for example, a 'TFT LCD' or even higher ones than that. Furthermore, since the manufacturing process for the OLED is simple, the OLED has been attracting attention as the next-generation flat plate display device.

Referring to FIG. 1, there is illustrated a partial view of a conventional OLED.

As shown in the figure, the conventional OLED has a plurality of first electrodes 110 arranged in a parallel stripe pattern on a substrate 100 divided into a luminous portion A and a pad portion B. A multiplicity of second electrodes 120 is installed on the first electrodes 110 to be perpendicular thereto. Pixels 130 of the organic electroluminescence device are defined at intersecting areas of the first and the second electrodes 110 and 120, respectively, that are arranged orthogonally. Also, on every pixel 130, an organic thin film layer 140 including an organic emission layer is formed between the first electrodes 110 and the second electrodes 120.

Formed on the pad portion B of the substrate 100 are plural bus electrode patterns 150 and 160 connected to the second and the first electrodes 120 and 110, respectively. The bus electrode patterns 150 and 160 are typically formed together with the first electrodes 110, and they may be made of a transparent conductive material such as indium tin oxide (ITO), like the first electrodes 110. Further, auxiliary electrodes (not shown) made of chrome (Cr) or the like may be formed on a predetermined area of the first electrodes 110 to reduce the resistance thereof. In such a case, the bus electrode patterns 150 and 160 are formed together with the first electrodes 110 and the auxiliary electrodes, and thus ITO and Chrome (Cr) may be laminated in sequence. Further, though not shown in the drawing, a tape carrier package (TCP) is installed on the pad portion B such that it is electrically connected with the first electrodes 110, the second electrodes 120 and the bus electrode patterns 150 and 160. The TCP operates to apply electric signals to the pad portion B, thus driving the OLED.

It is well known in the art that, as the resistance of the bus electrode patterns 150 and 160 of the pad portion B decreases, a voltage drop due to the bus electrodes can be reduced when driving the OLED, which in turn allows a manufacture of a device featuring a low driving voltage and a low power consumption. For the reason, the resistance of the bus electrode patterns 150 and 160 needs to be reduced.

SUMMARY OF THE INVENTION

It is, therefore, an object of the present invention to provide an organic electroluminescence device (OLED) having a bus electrode pattern of a low resistance, thus reducing a power consumption and a driving voltage, thereby resulting in improvement of electrical characteristics of the device. In accordance with a first aspect of the present invention, there is provided an organic electroluminescence device including:

a substrate having a luminous portion and a pad portion;

first electrodes arranged on the luminous portion of the substrate in a single direction;

an insulating layer pattern formed on the first electrodes and the substrate in a lattice shape to define plural pixel openings on the first electrodes;

partition layers formed on the insulating layer pattern, the partition layers intersecting the first electrodes perpendicularly;

organic thin film formed on the pixel openings;

second electrodes formed on the organic thin film layer to be perpendicular to the first electrodes;

first bus electrode patterns formed on the pad portion of the substrate to be connected with the first electrodes;

second bus electrode patterns formed on the pad portion of the substrate to be connected with the second electrodes and containing a material for forming the second electrodes; and barrier films formed between the second bus electrode patterns.

In accordance with a second aspect of the present invention, there is provided a method for forming an organic electroluminescence device including the steps of:

forming first electrodes on a substrate in a single direction, the substrate having a luminous portion on which the first electrodes are formed and a pad portion;

forming first bus electrode patterns on the pad portion of the substrate such that the first bus electrode patterns are connected with the first electrodes while forming the first electrodes, the first bus electrode patterns including a material for forming the first electrodes;

forming second bus electrode patterns on the pad portion of the substrate while forming the first electrodes, the second bus electrode patterns including the first electrode forming material;

forming an insulating layer pattern on the first electrodes and the substrate in a lattice shape to define plural pixel openings on the first electrodes;

forming partition layers on the insulating layer pattern, the partition layers intersecting the first electrodes perpendicularly;

forming barrier films between the second bus electrode patterns while forming the partition layers;

forming an organic thin film layer on the pixel openings;

forming second electrodes on the organic thin film layer to be perpendicular to the first electrodes; and depositing a second electrode forming material on the second bus electrode patterns while forming second electrodes.

In accordance with a third aspect of the present invention, there is provided a method for forming an organic electroluminescence device including the steps of:

forming first electrodes on a substrate in a single direction, the substrate having a luminous portion on which the first electrodes are formed and a pad portion;

forming first bus electrode patterns on the pad portion of the substrate such that the first bus electrode patterns are connected with the first electrodes while forming the first electrodes, the first bus electrode patterns including a material for forming the first electrodes;

forming second bus electrode patterns on the pad portion of the substrate while forming the first electrodes, the second bus electrode patterns including the first electrode forming material;

forming an insulating layer pattern on the first electrodes and the substrate in a lattice shape to define plural pixel openings on the first electrodes;

forming partition layers on the insulating layer pattern, the partition layers intersecting the first electrodes perpendicularly;

forming barrier films between the first bus electrode patterns and the second bus electrode patterns while forming the partition layers;

forming an organic thin film layer on the pixel openings;

forming second electrodes on the organic thin film layer to be perpendicular to the first electrodes; and depositing a second electrode forming material on the first and the second bus electrode patterns while forming the second electrodes.

In accordance with a fourth aspect of the present invention, there is provided a method for forming an organic electroluminescence device including the steps of:

forming first electrodes on a substrate in a single direction, the substrate having a luminous portion on which the first electrodes are formed and a pad portion;

forming first bus electrode patterns on the pad portion of the substrate such that the first bus electrode patterns are connected with the first electrodes while forming the first electrodes, the first bus electrode patterns including a material for forming the first electrodes;

forming an insulating layer pattern on the first electrodes and the substrate in a lattice shape to define plural pixel openings on the first electrodes;

forming partition layers on the insulating layer pattern, the partition layers intersecting the first electrodes perpendicularly;

forming barrier films on the pad portion of the substrate while forming the partition layers;

forming an organic thin film layer on the pixel openings;

forming a mask film pattern for blocking the first bus electrode patterns;

forming second electrodes on the organic thin film layer to be perpendicular to the first electrodes by using the mask film pattern; and depositing a second electrode forming material between the barrier films to thereby form second bus electrode patterns while forming the second electrodes.

In accordance with a fifth aspect of the present invention, there is provided a method for forming an organic electroluminescence device including the steps of:

forming first electrodes on a substrate in a single direction, the substrate having a luminous portion on which the first electrodes are formed and a pad portion;

forming an insulating layer pattern on the first electrodes and the substrate in a lattice shape to define plural pixel openings on the first electrodes;

forming partition layers on the insulating layer pattern, the partition layers intersecting the first electrodes perpendicularly;

forming barrier films on the pad portion of the substrate while forming the partition layers;

forming an organic thin film layer on the pixel openings;

forming second electrodes on the organic thin film layer to be perpendicular to the first electrodes; and depositing a second electrode forming material between the barrier films to thereby form first and second bus electrode patterns while forming the second electrodes.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
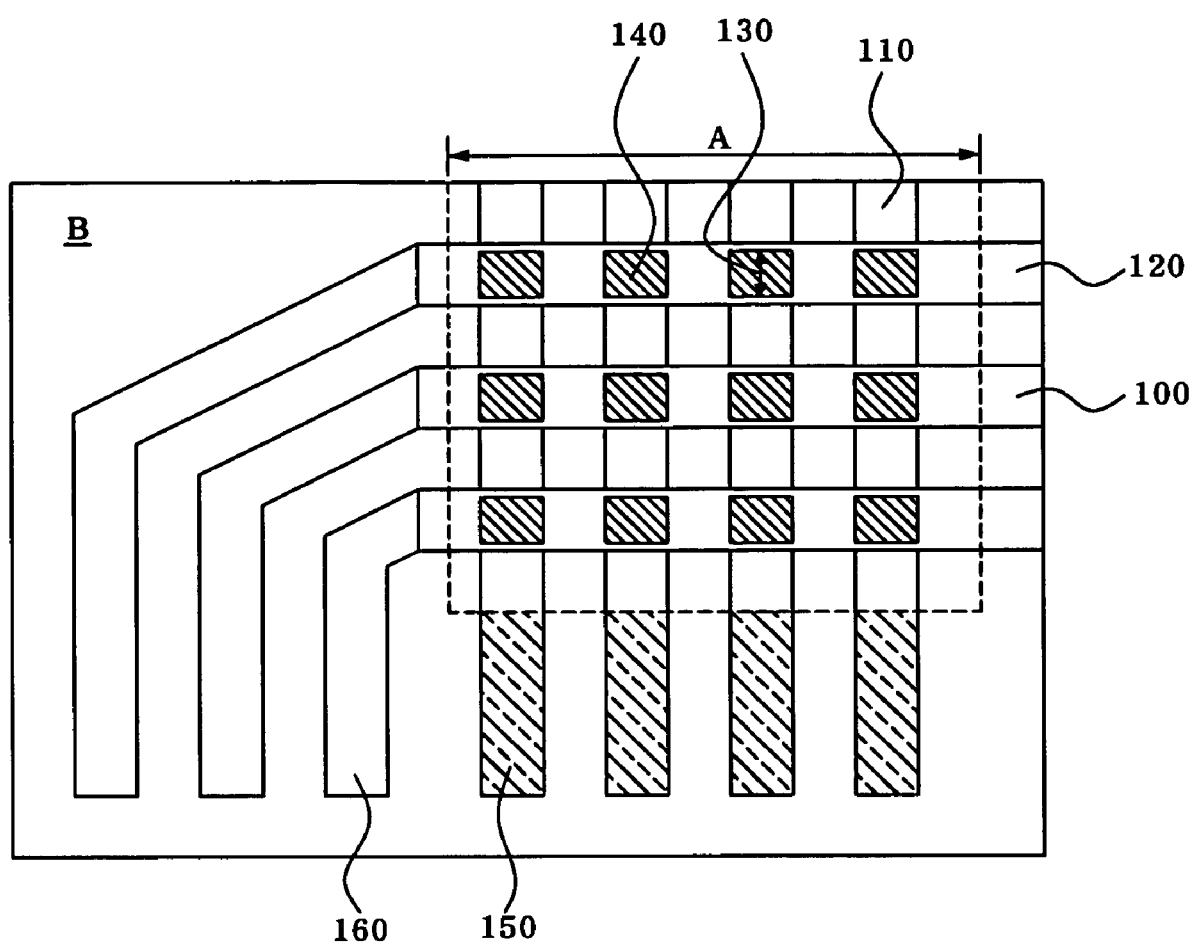
FIG. 1 presents a partial view of a conventional organic electroluminescence device.

Hereinafter, preferred embodiments of the present invention will be described in detail with reference to the accompanying drawings. Here, it is to be noted that the present invention is not limited to the preferred embodiments disclosed herein but can be modified in various ways. In the drawings, the thicknesses of elements are enlarged to show various layers and regions clearly. Further, in the following description, like reference numerals represents like components.

Figure 2:
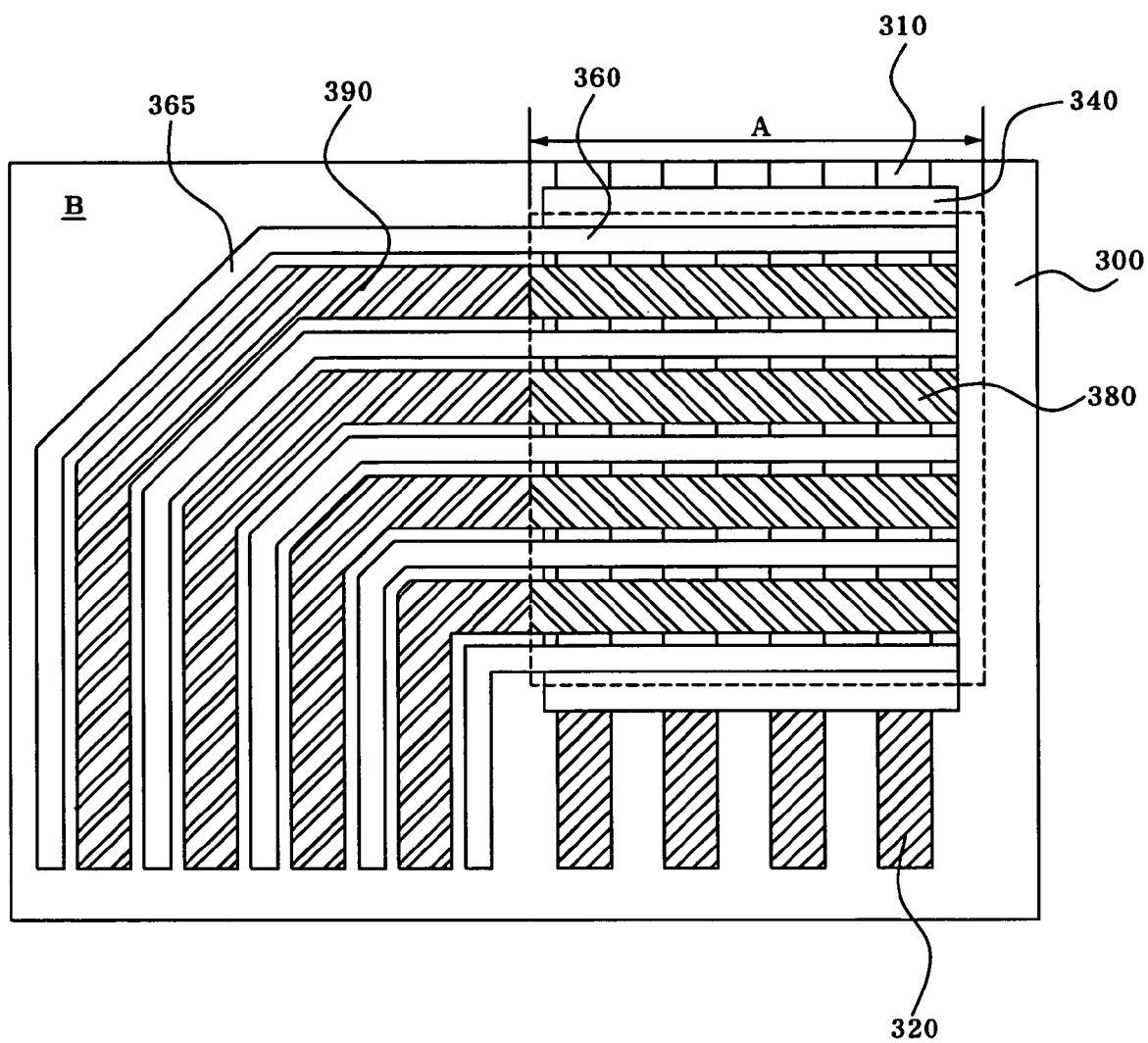
FIG. 2 sets forth a partial view of an organic electroluminescence device in accordance with the present invention.
Figure 7:
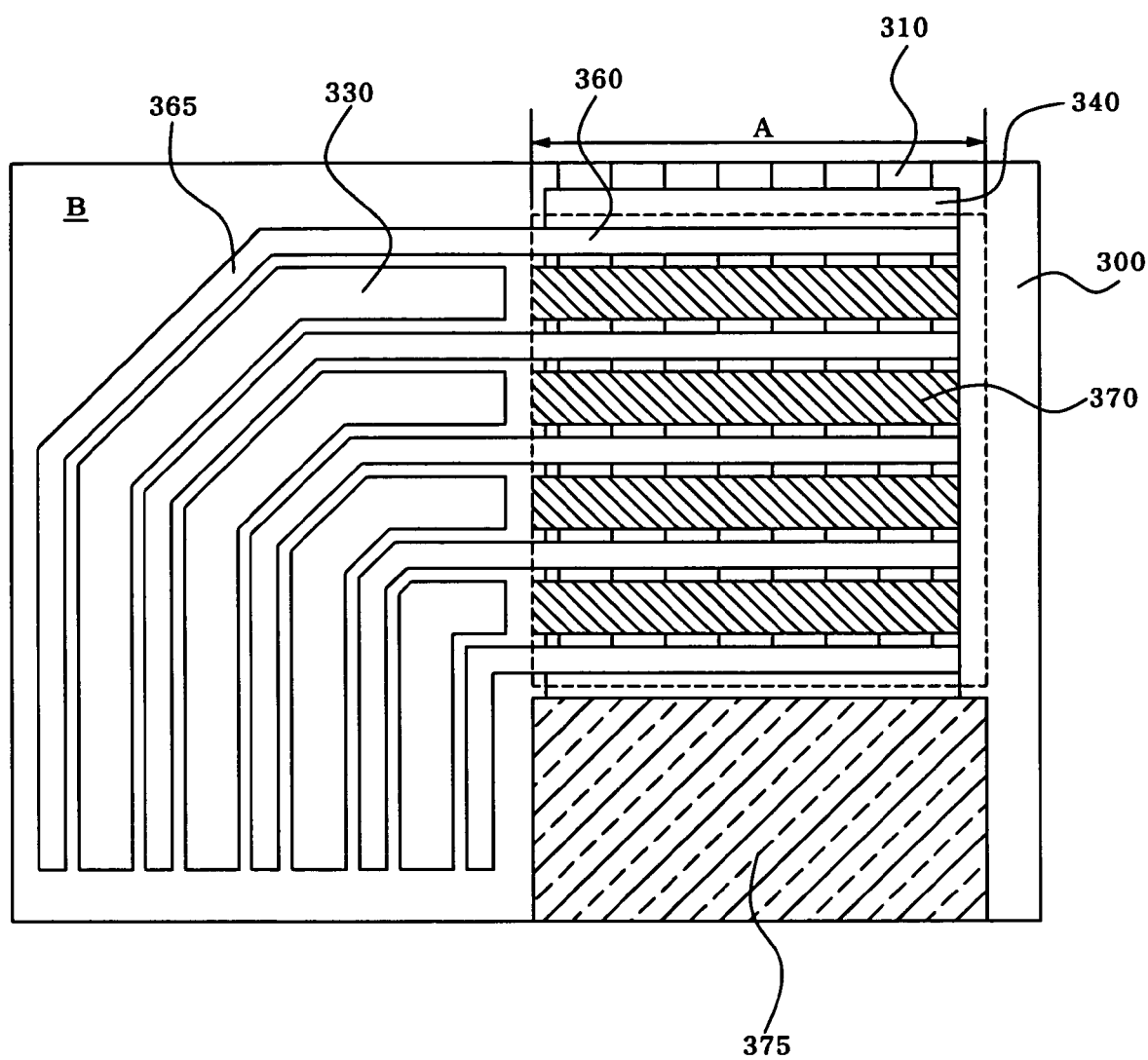
Figure 8:
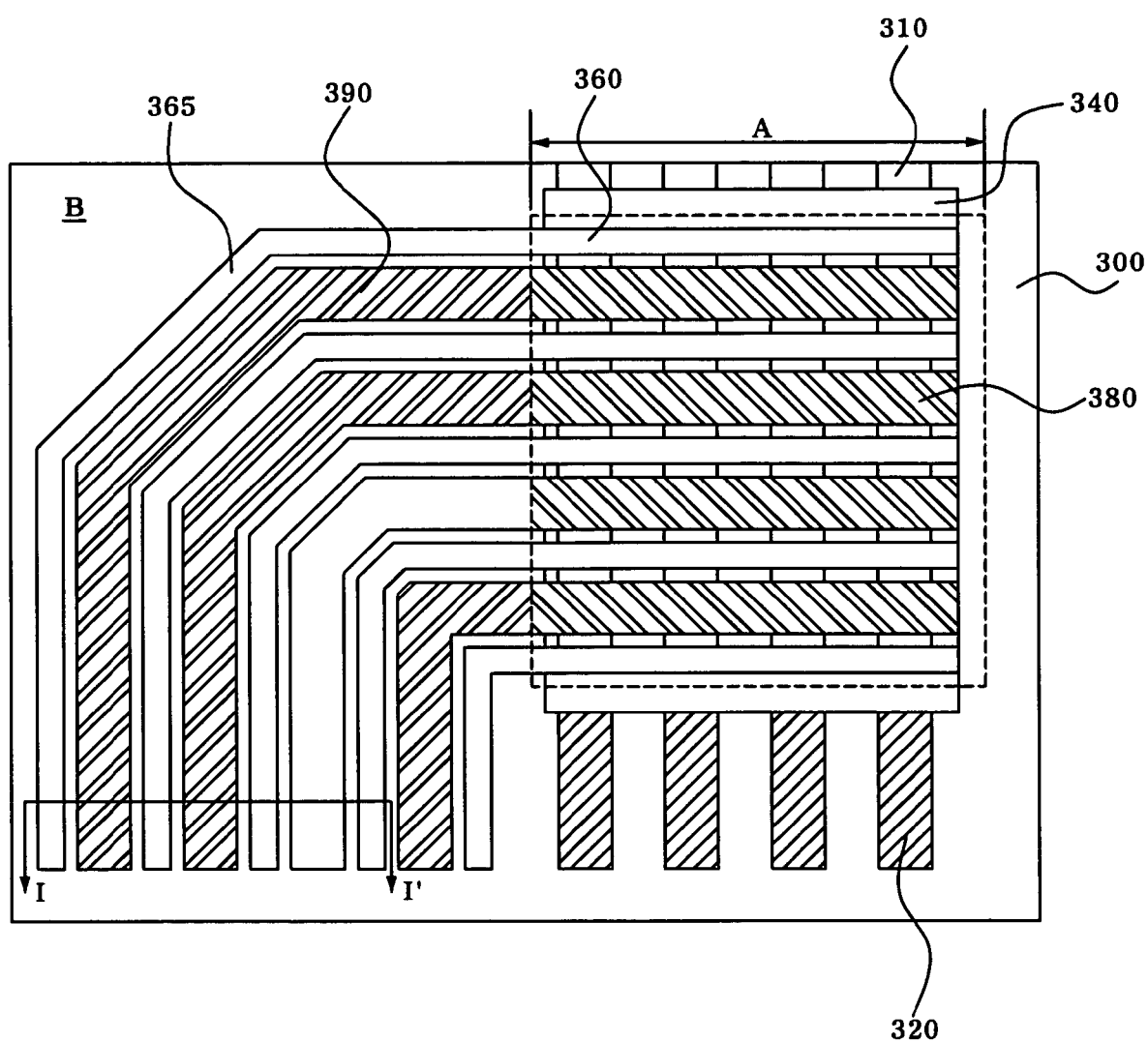
Figure 9:
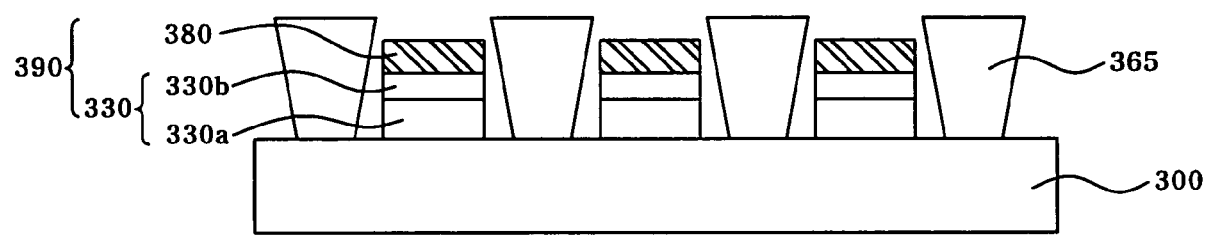

FIG. 2 sets forth a partial view of an organic electroluminescence device in accordance with the present invention; and FIGS. 3 to 9 illustrate a method for manufacturing the organic electroluminescence device in accordance with a first preferred embodiment of the present invention. In particular, FIG. 9 is a partial cross sectional view taken along a line I-I' of FIG. 8.

As shown in FIG. 2, the organic electroluminescence device of the present invention includes: a substrate 300 divided into a luminous portion A and a pad portion B; first electrodes 310 arranged on the luminous portion A of the substrate 300 in a single direction; an insulating layer pattern 340 formed on the first electrodes 310 and the substrate in a lattice shape to define plural pixel openings for pixels on the first electrodes 310; partition layers 360 formed on the area of the insulating layer pattern 340 intersecting the first electrodes perpendicularly; an organic thin film layer (not shown) deposited on the pixel openings; second electrodes 380 arranged on the pad portion B of the substrate 300 to be perpendicular to the first electrodes 310; first bus electrode patterns 320 formed on the pad portion B of the substrate B to be electrically connected with the first electrodes 310; second bus electrode patterns 390 formed on the pad portion B of the substrate 300, the second bus electrode patterns being formed together with the second electrodes 380 with the same material as that forming the second electrodes 380, to be electrically connected therewith; and barrier films 365 formed between the second bus electrode patterns 390. The barrier films 365 are connected with the partition layers 360 formed on the luminous portion A of the substrate 300.

Though not shown in the figure, the barrier films 365 can also be formed between the first bus electrode patterns 320 and/or between the second bus electrode patterns 330.

A method for manufacturing an organic electroluminescence device in accordance with a first preferred embodiment of the present invention will be described with reference to FIGS. 3 to 9.

Figure 3:
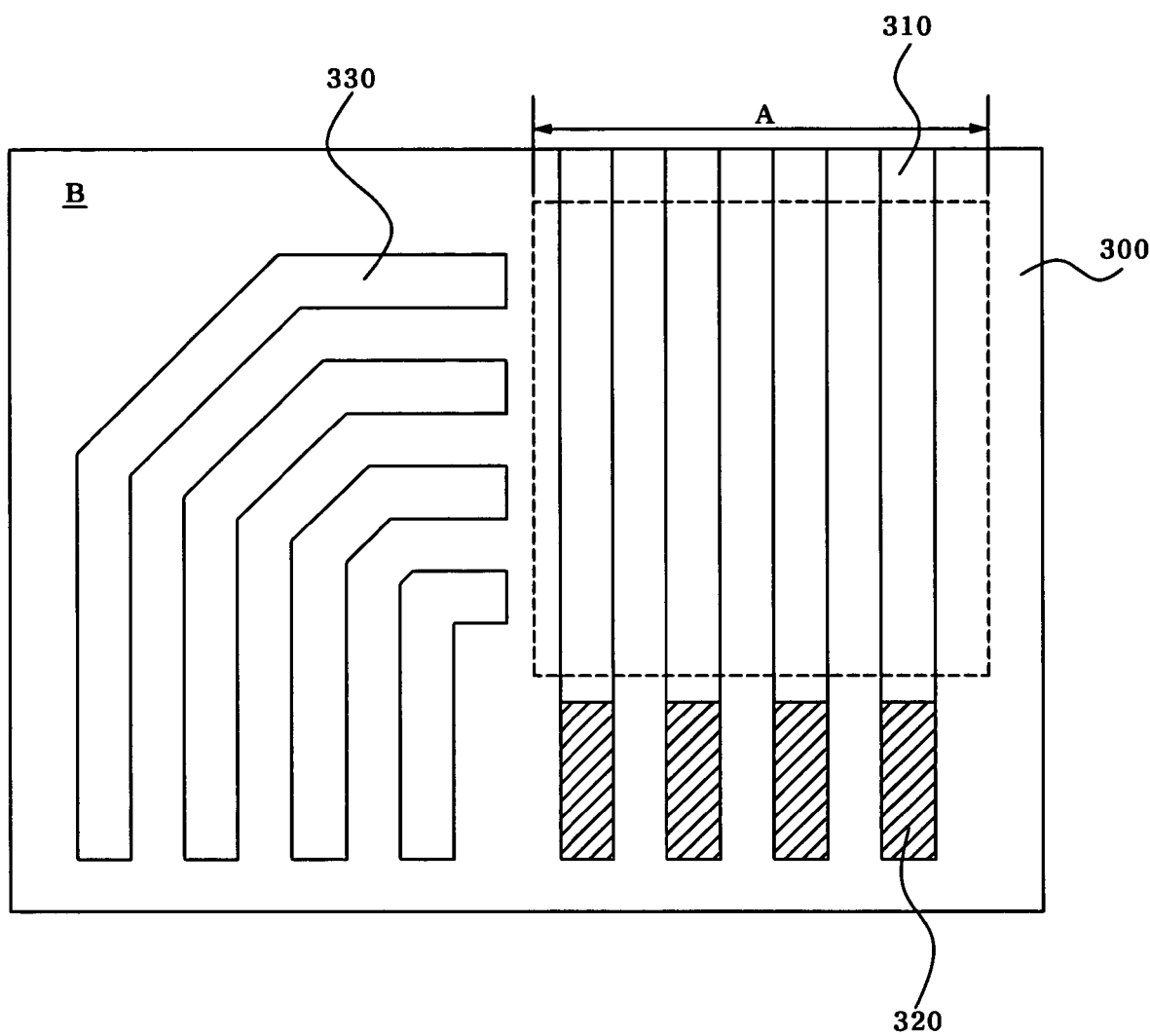
FIGS. 3 to 9 provide drawings for describing a manufacturing process for an organic electroluminescence device in accordance with a first preferred embodiment of the present invention.

Referring to FIG. 3, first electrodes 310 are formed on a substrate 300 including a luminous portion A and a pad portion B such that they are arranged in a single direction in parallel to each other. While forming the first electrodes 310, bus electrode patterns, e.g., first and second bus electrode patterns 320 and 330, respectively, to be connected with an external driving circuit later are also formed on the pad portion B of the substrate 200. The first bus electrode patterns 320 are connected with the first electrodes 310, whereas the second bus electrode patterns 330 are connected with second electrodes to be formed later.

In general, the substrate 300 is made of glass, and the first electrodes 310 are made of a transparent conductive material such as indium tin oxide (ITO) or indium zinc oxide (IZO). Further, the first and the second bus electrode patterns 320 and 330, respectively, are formed together with the first electrodes 310, and are also made of the same transparent conductive material as that forming the first electrodes 310, e.g., ITO or IZO. Also, if auxiliary electrodes (not shown) are selectively formed on predetermined areas of the first electrodes 310 with a material having a small resistance and a small resistivity such as chrome (Cr) or molybdenum (Mo) in order to obtain the purpose of reducing the resistance of the first electrodes 310, the first and the second bus electrode patterns 320 and 330 are, respectively, formed together with the first electrodes 310 and the auxiliary electrode. As a sequence, each of them is configured to have a laminated structure of ITO and Cr or IZO and Cr deposited in sequence.

Figure 4:
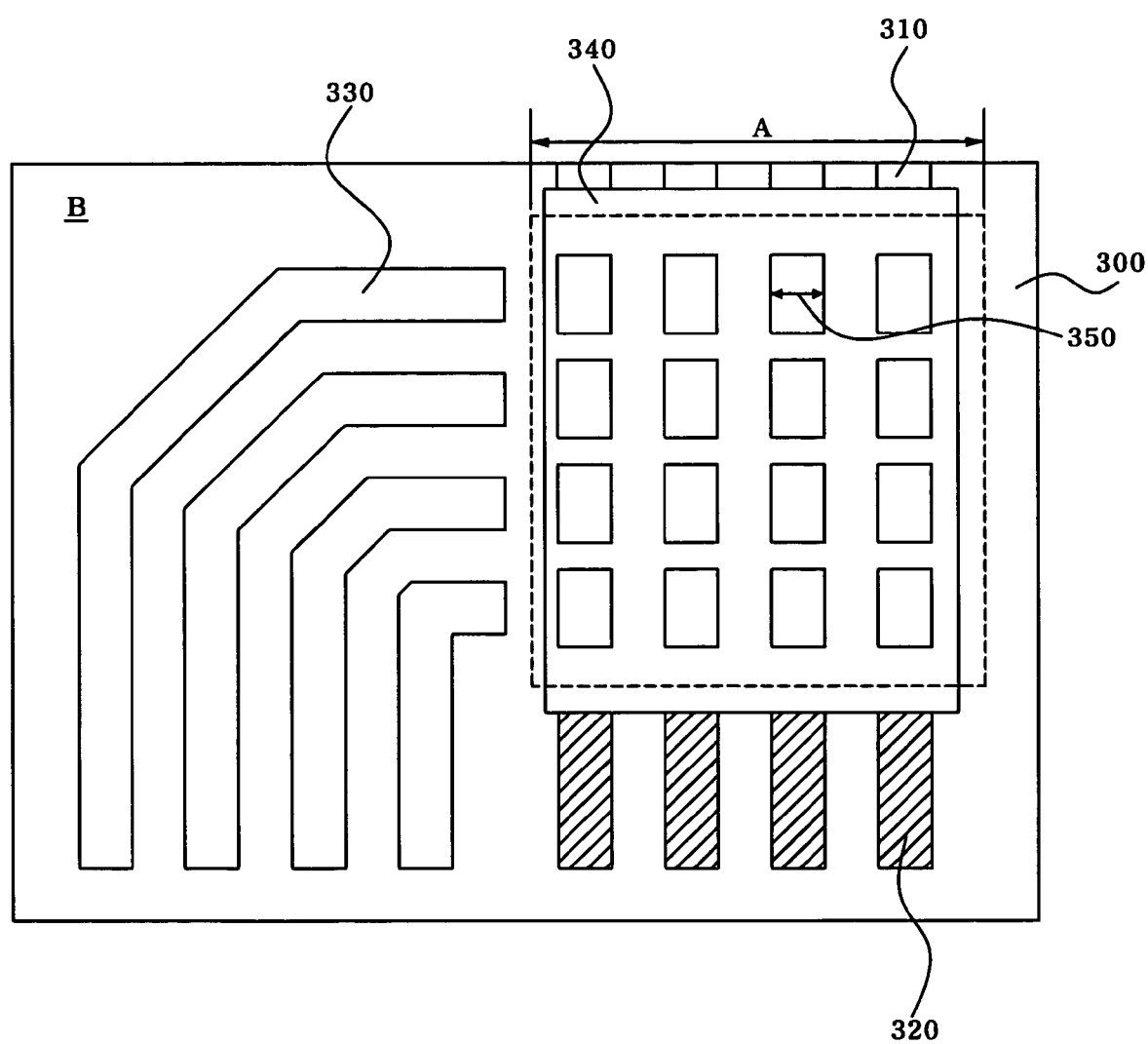

Referring to FIG. 4, an insulating layer pattern 340 is formed on the first electrodes 310 to have a lattice shape when viewed from a plan view, to thereby define pixel openings 350. The pixel openings 350 formed by the insulating layer pattern 340 define pixel formation areas on which pixels are to be formed.

Figure 5:
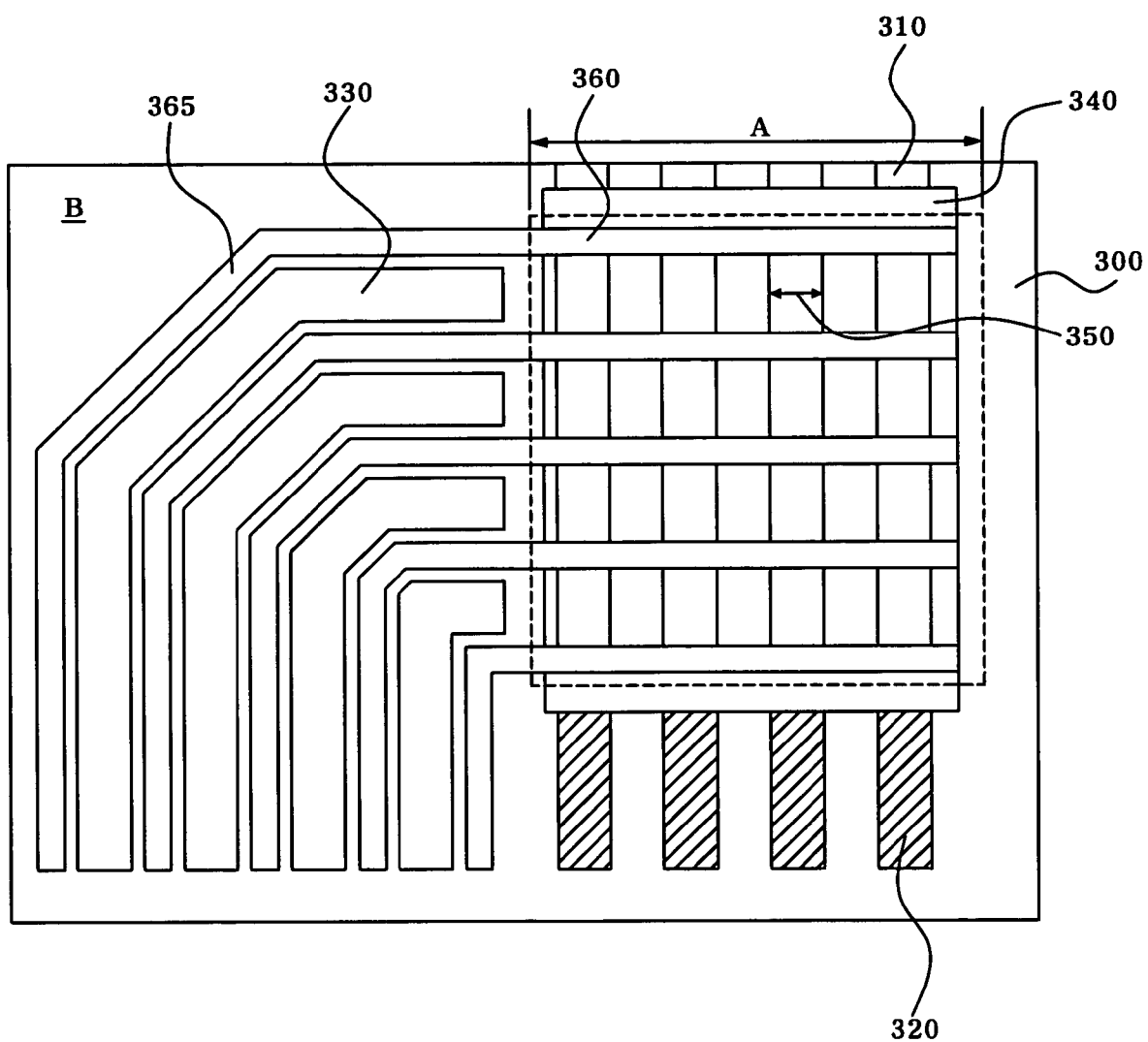

Then, referring to FIG. 5, after depositing a negative type photo-resist film on the entire surface of the substrate 300 including the insulating layer pattern 340, an exposure and a development process are performed to form partition layers 360, each having an adverse slope. The partition layers 360 are arranged at a preset interval such that they are parallel to each other and are perpendicular to the first electrodes 310. Further, the partition layers 360 have an overhang structure to prevent the second electrodes to be formed later from being short-circuited from neighboring elements.

While forming the partition layers 360 on the entire surface of the substrate 300, barrier films 365 are formed between the second bus electrode patterns 330. Preferably, the barrier films 360 are connected with the partition layers 360. The barrier films 365 are located between the second bus electrode patterns 330 on the pad portion B, and they serve to separate the second bus electrode patterns 330 from each other. The barrier films 365 may be formed of the same material as that forming the partition layers 360, for example, a negative-type photo-resist film.

Figure 6:
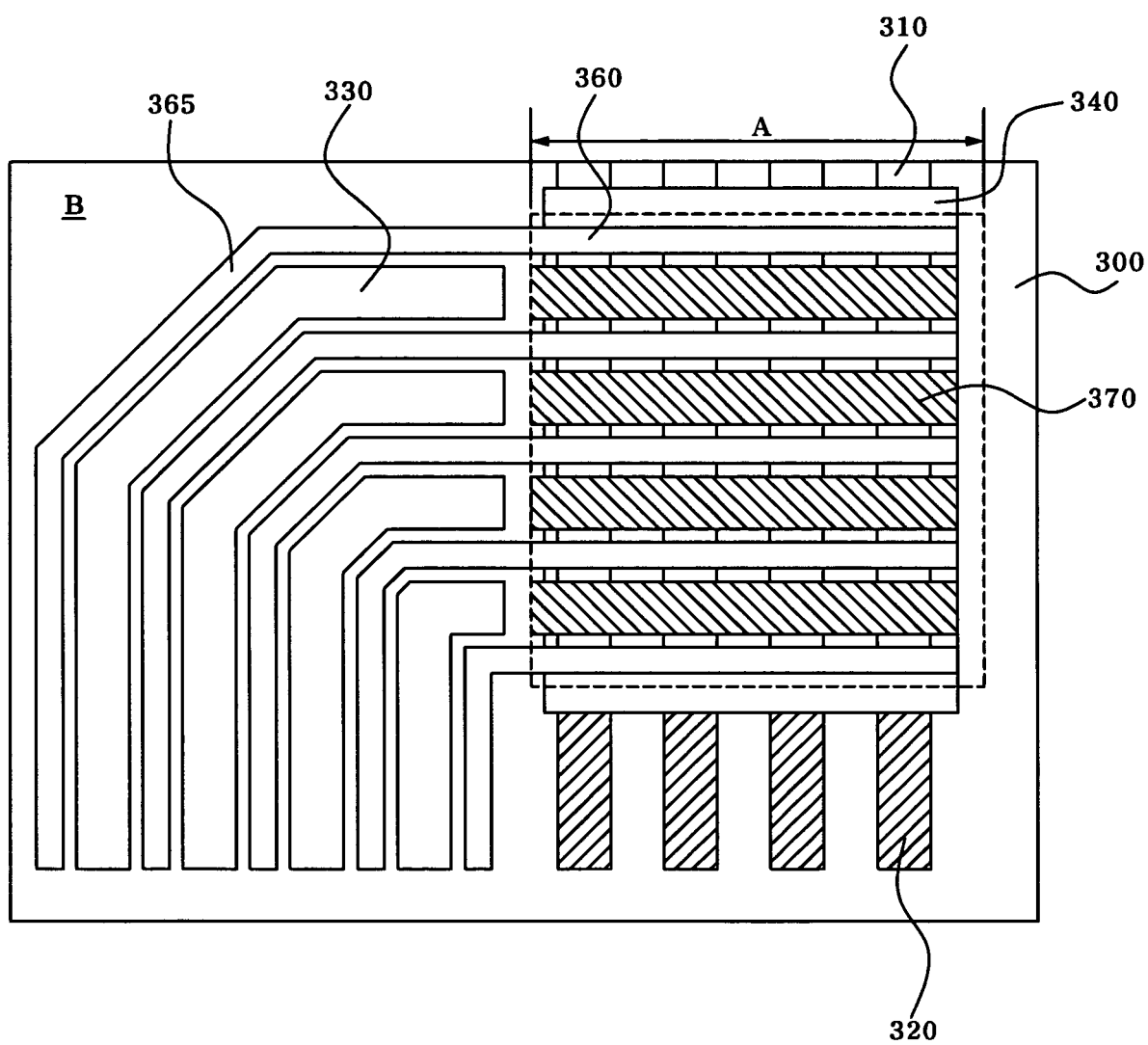

Subsequently, as shown in FIG. 6, an organic thin film layer 370 including an organic emission layer and the like is deposited on the pixel openings on which pixels are to be formed. Though not shown in the drawing, the organic thin film layer 370 is configured to have a laminated structure including a hole injecting layer, a hole transporting layer, a light-emitting layer and an electron transporting layer.

Thereafter, as shown in FIG. 7, a mask film pattern 375 is formed to cover the areas of the pad portion B on which the first bus electrode patterns 320 are located. The mask film pattern 375 serves to prevent a deposition of first bus electrode patterns (not shown) when depositing the second electrodes during a subsequent process.

Next, as shown in FIGS. 8 and 9, second electrodes 380 are formed on the organic thin film layer 370 in a manner that they are perpendicular to the first electrodes 310. The second electrodes 380 may be formed of a metallic material used for forming electrode, such as aluminum (Al), copper (Cu) or silver (Ag) or an alloy thereof.

At this time, while forming the second electrodes 380 on the organic thin film layer 370, the material for forming the second electrodes 380 is extended to and deposited on the pad portion B of the substrate 300. The material for forming the second electrodes 380 is an electrode-forming metallic material containing Al, Cu or Ag or an alloy thereof.

Accordingly, the second bus electrode patterns 390 are configured to have a laminated structure including the layer of the second electrode forming material deposited on ITO or IZO or a laminated structure including the layer of the second electrode forming material deposited on ITO and Cr or IZO and Cr layers laminated in sequence.

If the second electrode forming material, e.g., Al is deposited on the second bus electrode patterns 330 formed of two layers 330a and 330b of ITO and Cr or IZO and Cr laminated in sequence, the resistance of the area having the second electrode forming material deposited thereon is reduced $\frac{1}{10}$ to a $\frac{1}{8}$ of the conventional resistance. Thus, when driving the organic electroluminescence device by connecting it to an external driving circuit later, a power consumption and a driving voltage are reduced, resulting in improvement of the electrical characteristics of the device.

Figure 11:
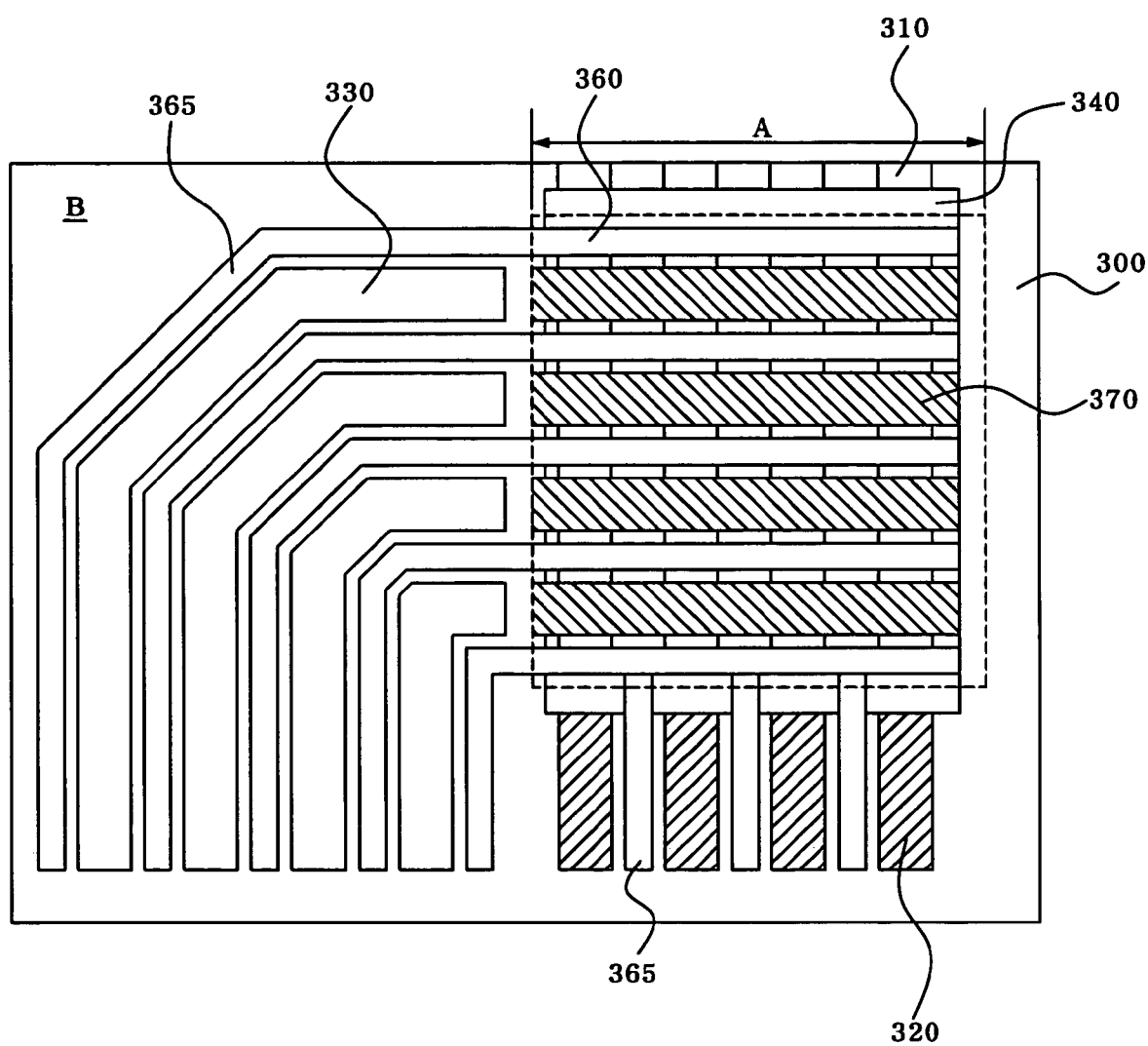
Figure 12:
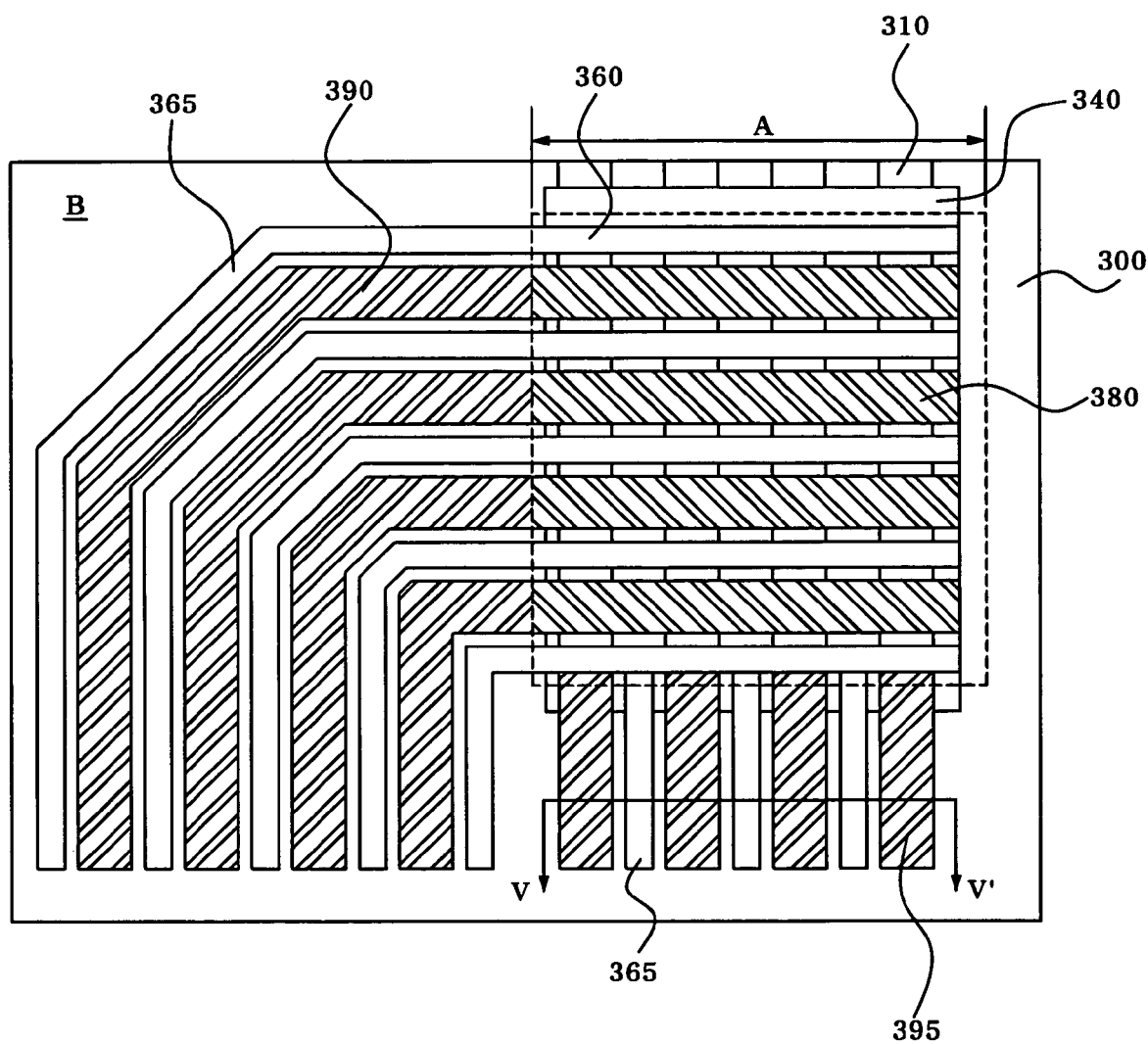
Figure 13:
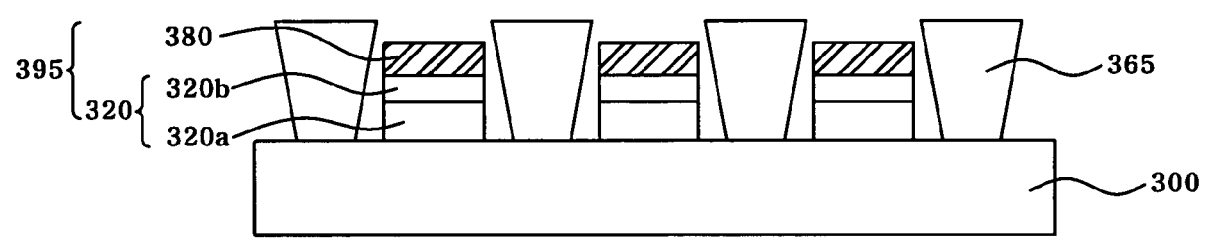

FIGS. 10 to 13 describe a method for manufacturing an organic electroluminescence device in accordance with a second preferred embodiment of the present invention. In particular, FIG. 13 shows a cross sectional view taken along a line V-V' of FIG. 12.

First, as set forth above with reference to FIGS. 3 and 4, first electrodes 310, first bus electrode patterns 320 and second bus electrode patterns 330 are formed on a substrate 300 including a luminous portion A and a pad portion B. Then, a lattice-shape insulating layer pattern 340 is formed on the first electrodes 310 to define pixel openings 350.

Figure 10:
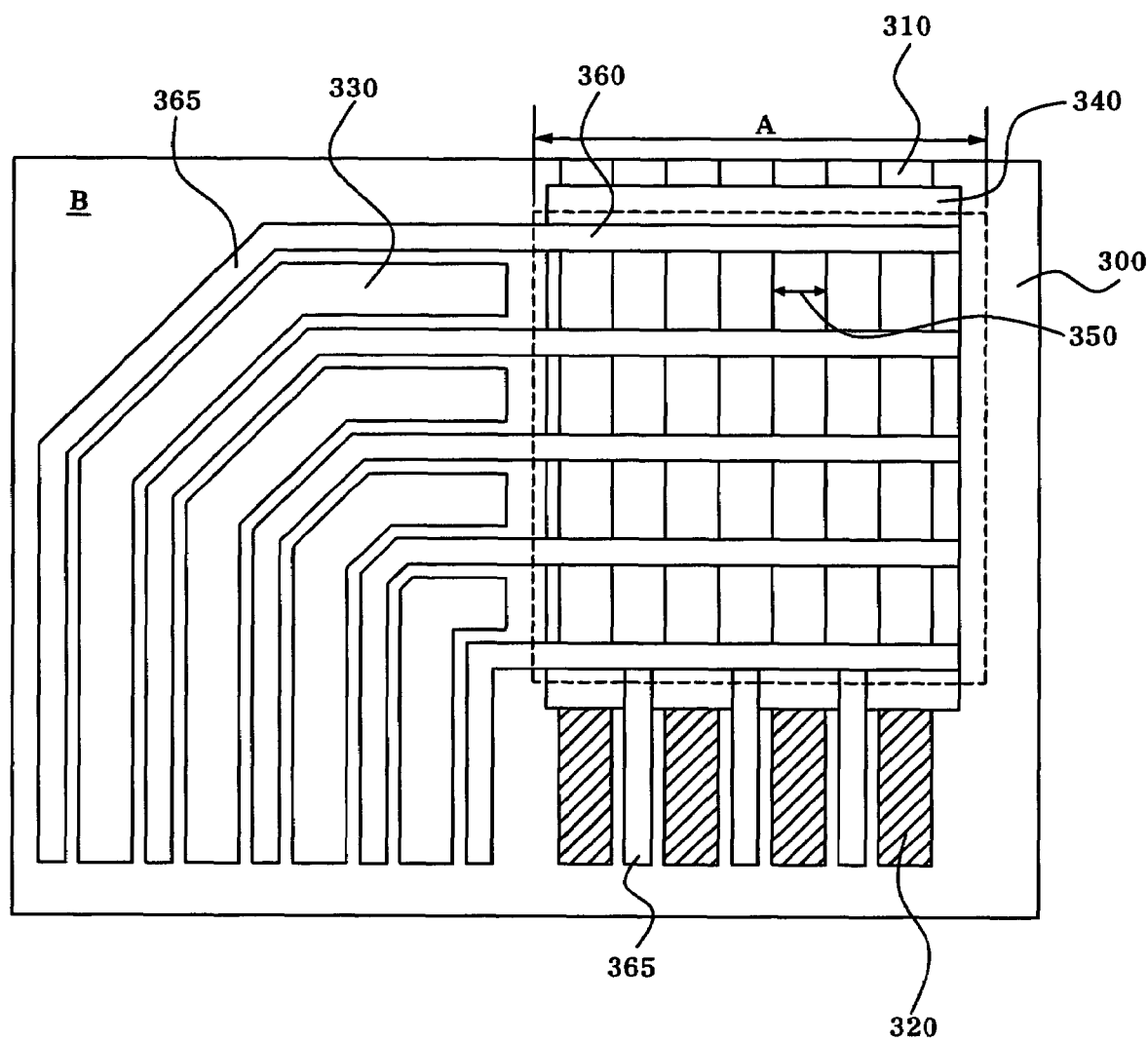
FIGS. 10 to 13 depict drawings for describing a manufacturing process for an organic electroluminescence device in accordance with a second preferred embodiment of the present invention.

Thereafter, as shown in FIG. 10, a photo-resist film is deposited on the entire surface of the substrate 300, after which an exposure and a development process are conducted to obtain partition layers 360 with an adverse slope. The partition layers 360 are arranged in parallel to each other and perpendicular to the first electrodes 310. Also, the partition layers 360 have an overhang structure.

While forming the partition layers 360, barrier films 365 are concurrently formed between the first and the second bus electrode patterns 320 and 330. The barrier films 365 serve to prevent the first and the second bus electrode patterns 320 and 330 from being short-circuited when depositing a material for forming second electrodes later. The barrier films 365 between the second bus electrode patterns 330 are preferably connected to the partition layers 360. Further, the barrier films 365 between the first bus electrode patterns 320 may also be connected to the partition layers 360.

Subsequently, as shown in FIG. 11, an organic thin film layer 370 including an organic emission layer and the like is deposited on the pixel openings 350.

Then, as shown in FIGS. 12 and 13, second electrodes 380 are formed on the organic thin film layer 370 such that they are perpendicular to the first electrodes 310. While forming the second electrodes 380 on the organic thin film layer 370, the material for forming the second electrodes is extended to and deposited on the pad portion B of the substrate 300, thus obtaining first bus electrode patterns 395 and second bus electrode patterns 390 having the second electrode forming material deposited thereon. The first bus electrode patterns 395 may include laminated multi-layer structures 320a and 320b formed of ITO and Cr or IZO and Cr layers deposited in sequence. The material for forming the second electrodes includes Al, Cu or Ag. Further, since the areas on which the first bus electrode patterns 395 and the second bus electrode patterns 390 are to be formed are already separated due to the presence of the barrier films 365 which have been formed in advance, the deposition of the second electrode forming material can be conducted without having to use a mask.

As described, with the structure including the layer of the second electrode forming material deposited on bus electrode patterns formed of ITO and Cr or IZO and Cr laminated in sequence, the first and the second bus electrode patterns 395 and 390, respectively, are allowed to have a further reduced resistance. As a consequence, when driving the organic electroluminescence device by connecting it to an external driving circuit later, a power consumption and a driving voltage can be reduced, resulting in improvement of the electrical characteristics of the device.

Figure 18:
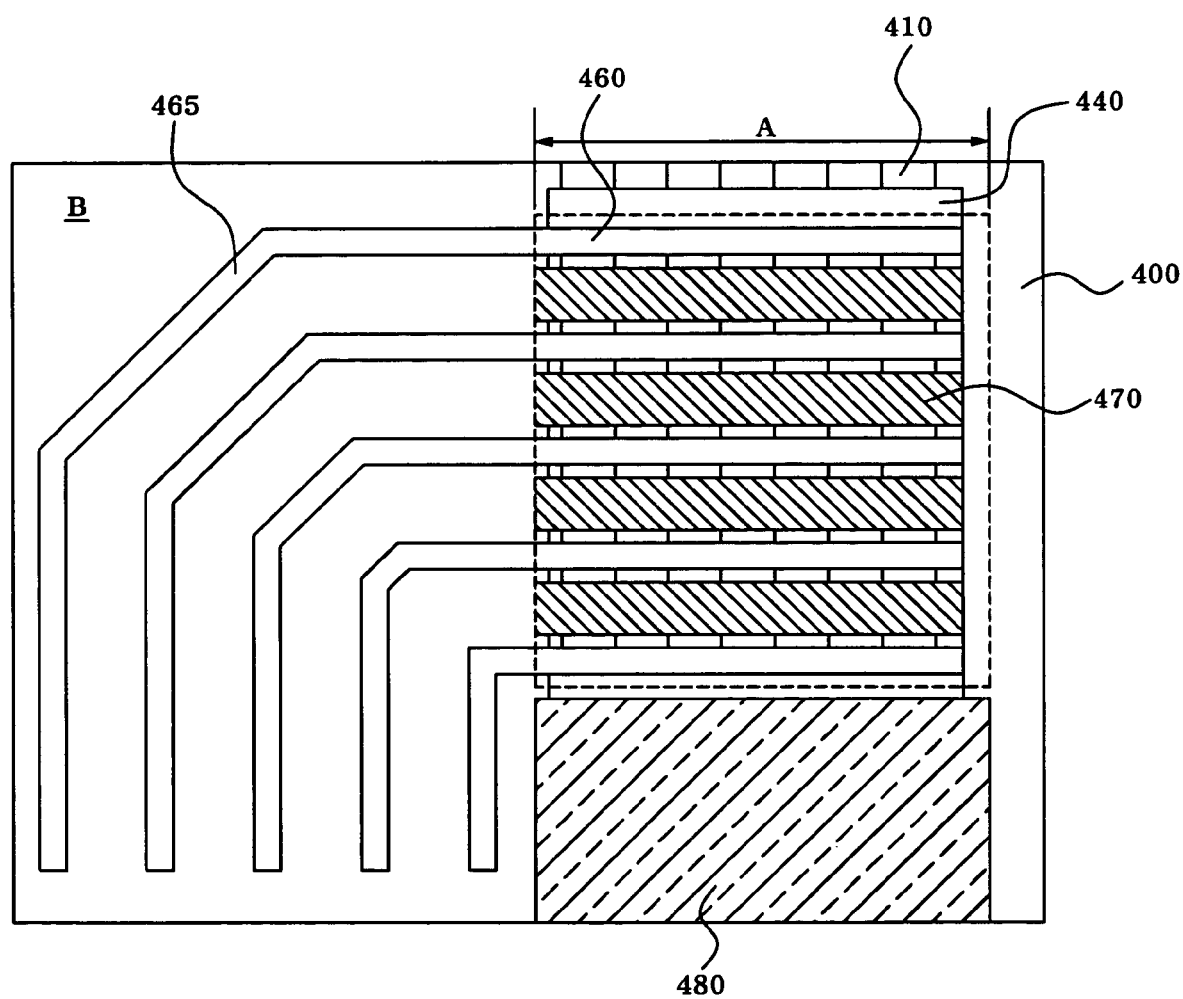
Figure 19:
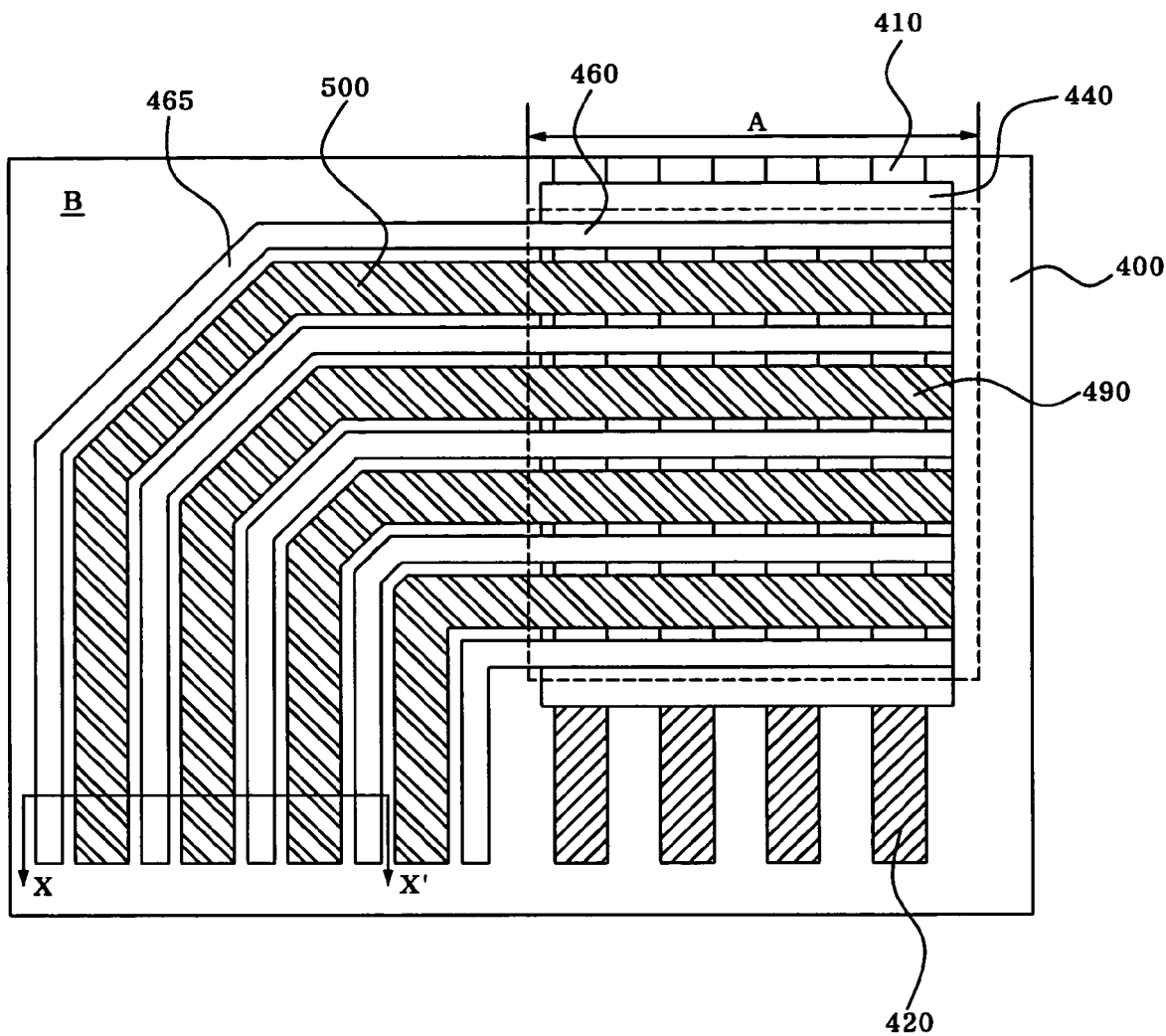
Figure 20:
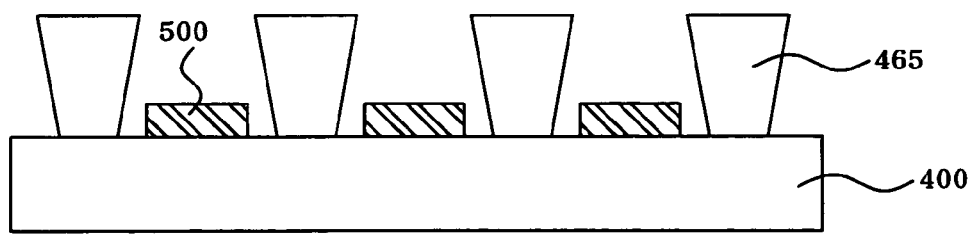

FIGS. 14 to 20 describe a method for manufacturing an organic electroluminescence device in accordance with a third preferred embodiment of the present invention. In particular, FIG. 20 is a partial cross sectional view taken along a line X-X' of FIG. 19.

Figure 14:
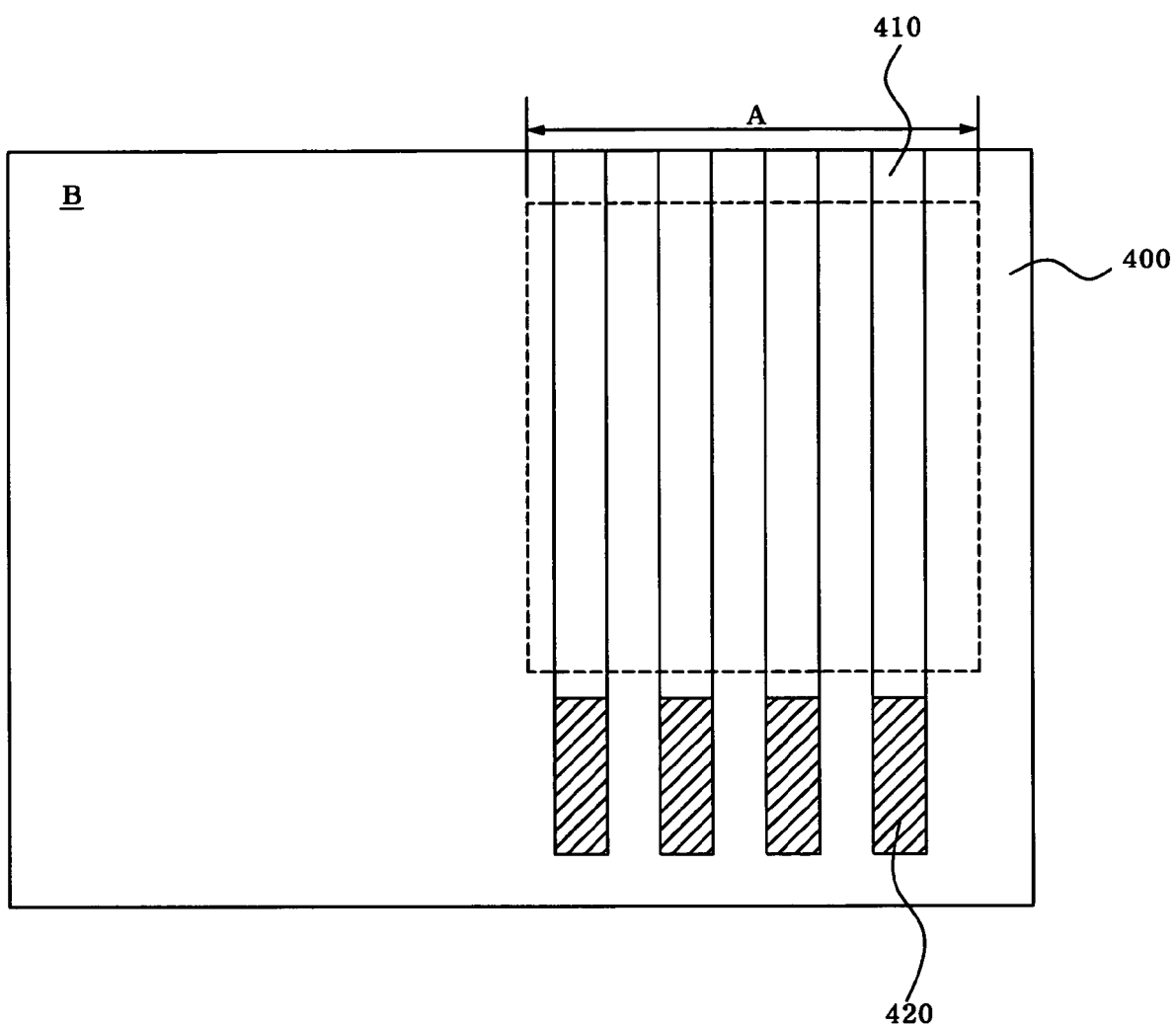
FIGS. 14 to 20 offer drawings for describing a manufacturing process for an organic electroluminescence device in accordance with a third preferred embodiment of the present invention.

Referring to FIG. 14, first electrodes 410 are formed on a substrate 400 including a luminous portion A and a pad portion B such that they are arranged in a single direction in parallel to each other. While forming the first electrodes 410, bus electrode patterns to be connected to an external driving circuit later, e.g., first bus electrode patterns 420 are also formed on the pad portion B of the substrate 400. The first bus electrode patterns 420 are connected with the first electrodes 410.

The first electrodes 410 are made of a transparent conductive material such as ITO or IZO. Further, the first bus electrode patterns 420 formed together with the first electrodes 410 are also made of the same conductive material as that for forming the first electrodes 410, e.g., ITO or IZO. Also, auxiliary electrodes (not shown) may be selectively formed on predetermined areas of the first electrodes 410 with a material having a small resistance and a small resistivity, e.g., Cr or Mo, for the purpose of reducing the resistance of the first electrodes 410. In such a case, the first bus electrode patterns 420 can be formed together with the first electrodes 410 and the auxiliary electrodes, and thus the first bus electrode patterns 420 can be configured to have a laminated multi-layer structure of ITO and Cr or IZO and Cr deposited in sequence.

Meanwhile, the rest area of the pad portion B except for where the first bus electrode patterns 420 are formed, e.g., the area on which second bus electrode patterns connected with second electrodes are to be formed, can be formed at a time of depositing an electrode material for forming the second electrodes. Description thereof will be provided later.

Figure 15:
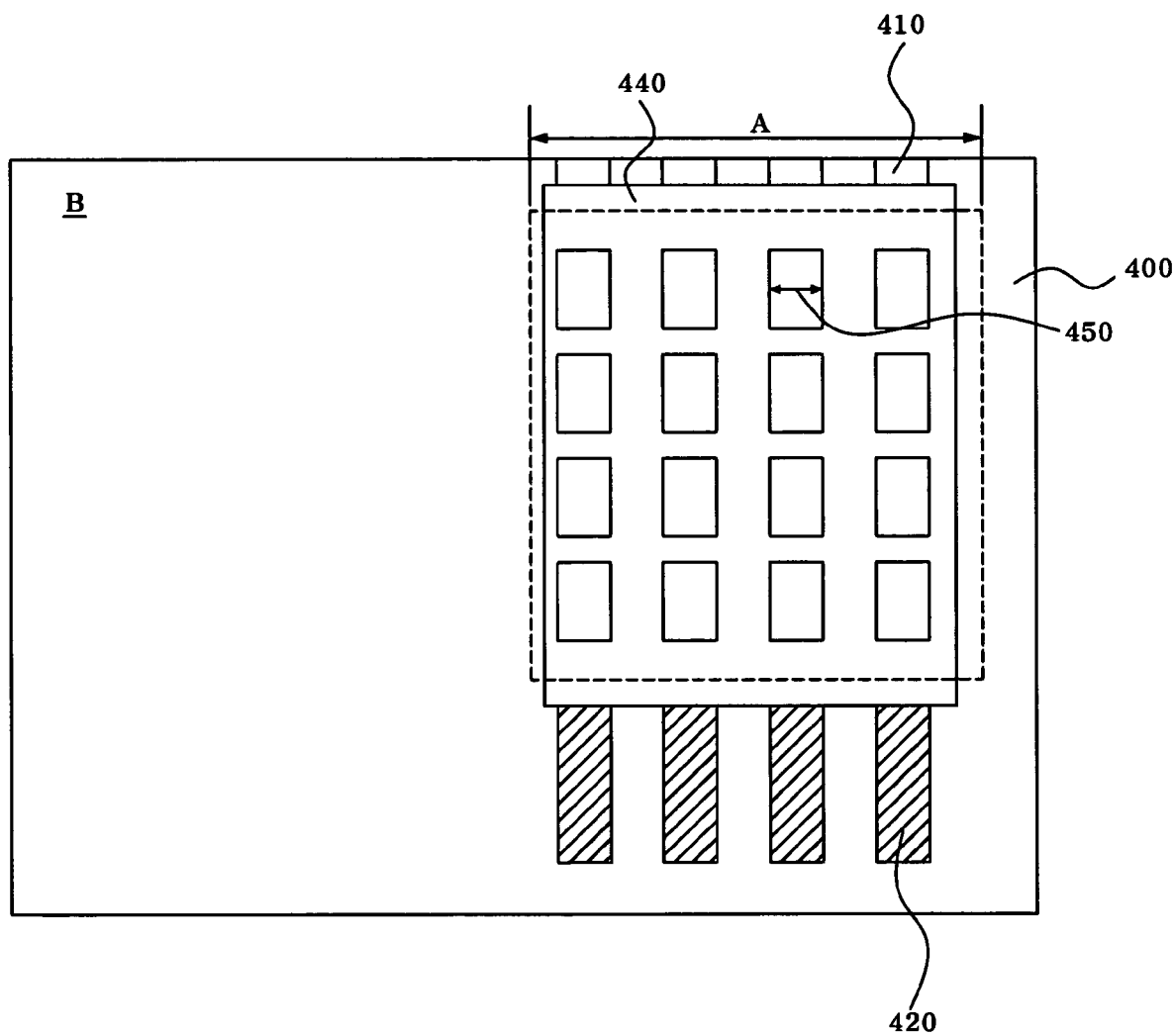

Referring to FIG. 15, an insulating layer pattern 440 is formed on the first electrodes 410 disposed on the luminous portion A of the substrate 400 such that it has a lattice shape when viewed from a plan view, to thereby define pixel openings 450 on the first electrodes 410. The pixel openings 450 formed by the insulating layer pattern 440 define pixel formation areas on which pixels are to be formed.

Figure 16:
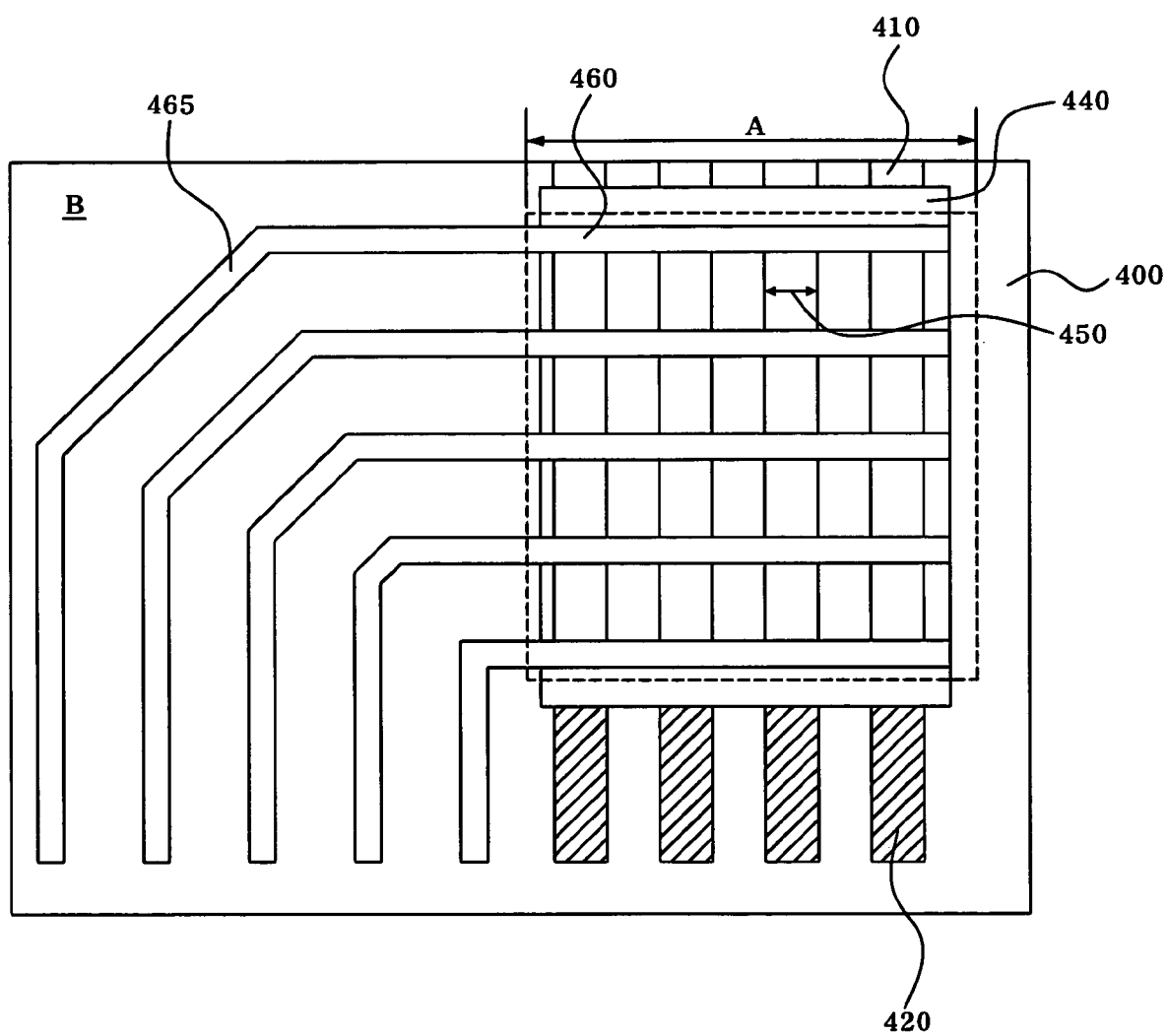

Then, referring to FIG. 16, after depositing a photo-resist film on the entire surface of the substrate 400 including the insulating layer pattern 440, an exposure and a development process is performed, so that partition layers 460 each having an adverse slope are obtained. The partition layers 460 are arranged at a preset interval such that they are parallel to each other and are perpendicular to the first electrodes 410. Further, the partition layers 460 have an overhang structure to prevent the second electrodes to be formed later from being short-circuited from neighboring elements.

While forming the partition layers 460, barrier films 465 are extended to and formed on the pad portion B. Preferably, the barrier films 465 are connected with the partition layers 460. The barrier films 465 are located between the second bus electrode patterns to be formed later, and they serve to separate the second bus electrode patterns from each other. The barrier films 465 may be formed of the same material as that of forming the partition layers 460, for example, a negative-type photo-resist film.

Figure 17:
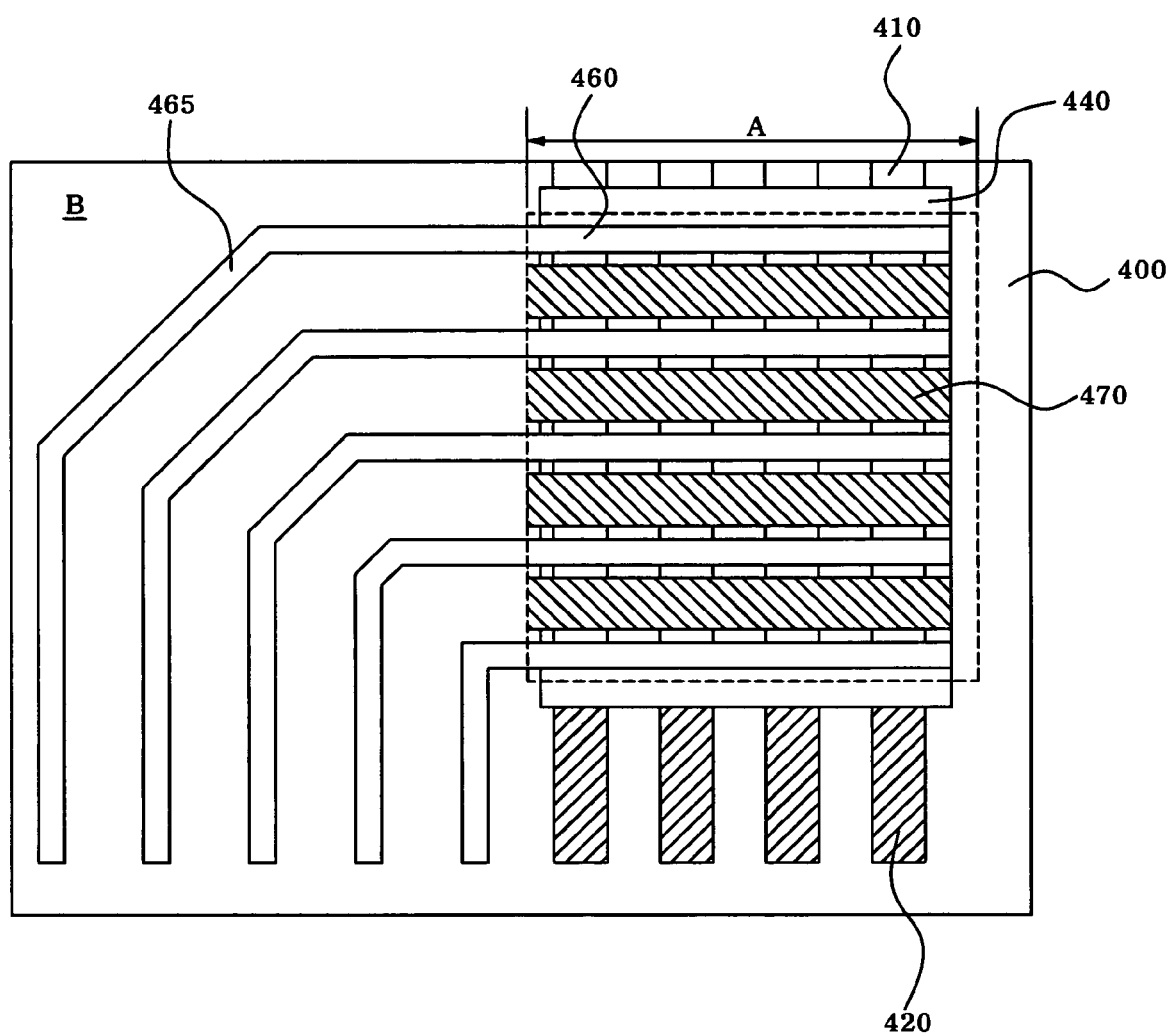

Subsequently, referring to FIG. 17, an organic thin film layer 470 including an organic emission layer and the like is formed on the pixel openings 450. Though not shown in the drawing, the organic thin film layer 470 is configured to have a laminated structure including a hole injecting layer, a hole transporting layer, an organic electroluminescent layer and an electron transporting layer, all of which are laminated on the pixel openings formed by the insulating layer pattern 440.

Thereafter, referring to FIG. 18, a mask film pattern 480 is formed to cover the areas of the pad portion B on which the first bus electrode patterns 420 are located. The mask film pattern 480 serves to block the first bus electrode patterns 420 when depositing a second electrode forming material during a subsequence process.

Next, as shown in FIGS. 19 and 20, second electrodes 490 are formed on the organic thin film layer 470 in a manner such that they are perpendicular to the first electrodes 410. Each second electrode 480 may be configured as a single layer or multi layers having two or more layers formed of a metallic material containing Al, Cu or Ag.

While forming the second electrodes 490 on the organic thin film layer 470, the material for forming the second electrodes 490 is also extended to and deposited on the pad portion B of the substrate 400 to thereby form second bus electrode patterns 500 on the pad portion B. The second electrode forming material is a metallic material such as Al, Cu or Ag. At this time, the second bus electrode patterns 500 are separated by the barrier films 465 which have been formed in advance.

As described, if the second bus electrode patterns 500 is formed by the deposition of the second electrode forming material, e.g., Al, the resistance of the second bus electrode patterns 500 can be further reduced in comparison with the case of forming the second bus electrode patterns as a laminated multi-layer structure of ITO and Cr or IZO and Cr deposited in sequence.

Thus, when driving the organic electroluminescence device by connecting it to an external driving circuit later, a power consumption and a driving voltage are reduced, resulting in improvement of the electrical characteristics of the device. Furthermore, by forming the second bus electrode patterns as a single layer containing the second electrode forming material, a defect generation can be reduced in comparison with the case of forming the second bus electrode patterns as a laminated multi-layer structure of ITO and Cr or IZO and CR. As a consequence, the reliability of the device can be improved.

Figure 24:
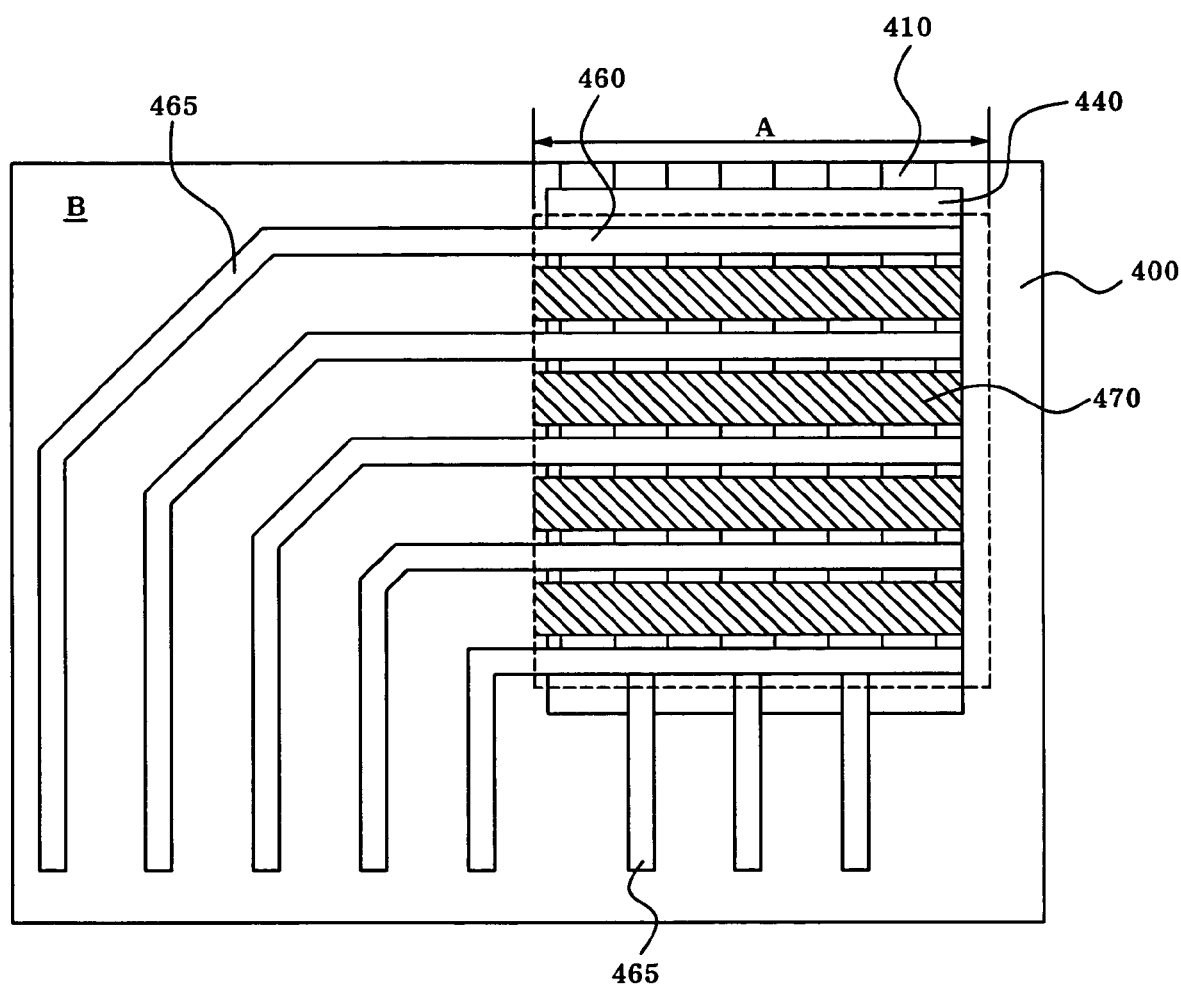
Figure 25:
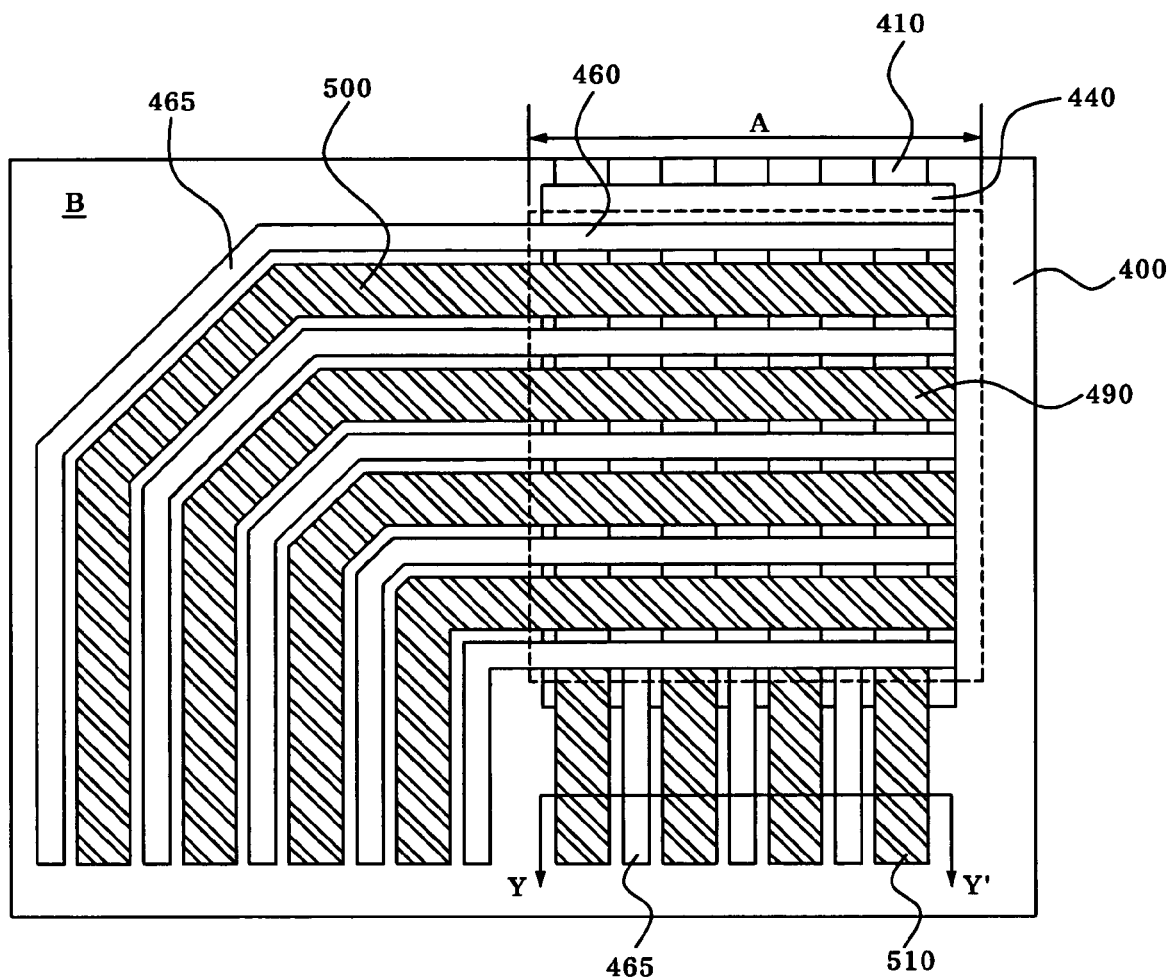
Figure 26:
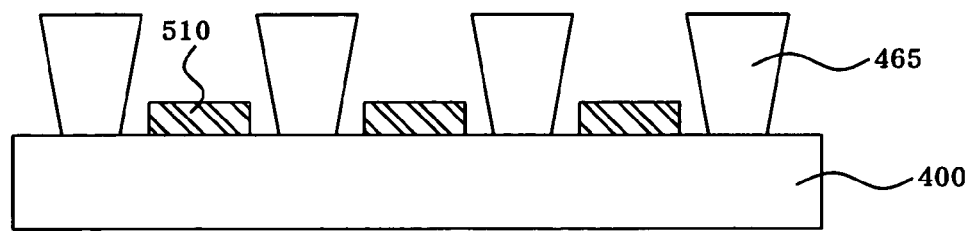

FIGS. 21 to 26 describe a method for manufacturing an organic electroluminescence device in accordance with a fourth preferred embodiment of the present invention. In particular, FIG. 26 is a partial cross sectional view taken along a line Y-Y' of FIG. 25.

Figure 21:
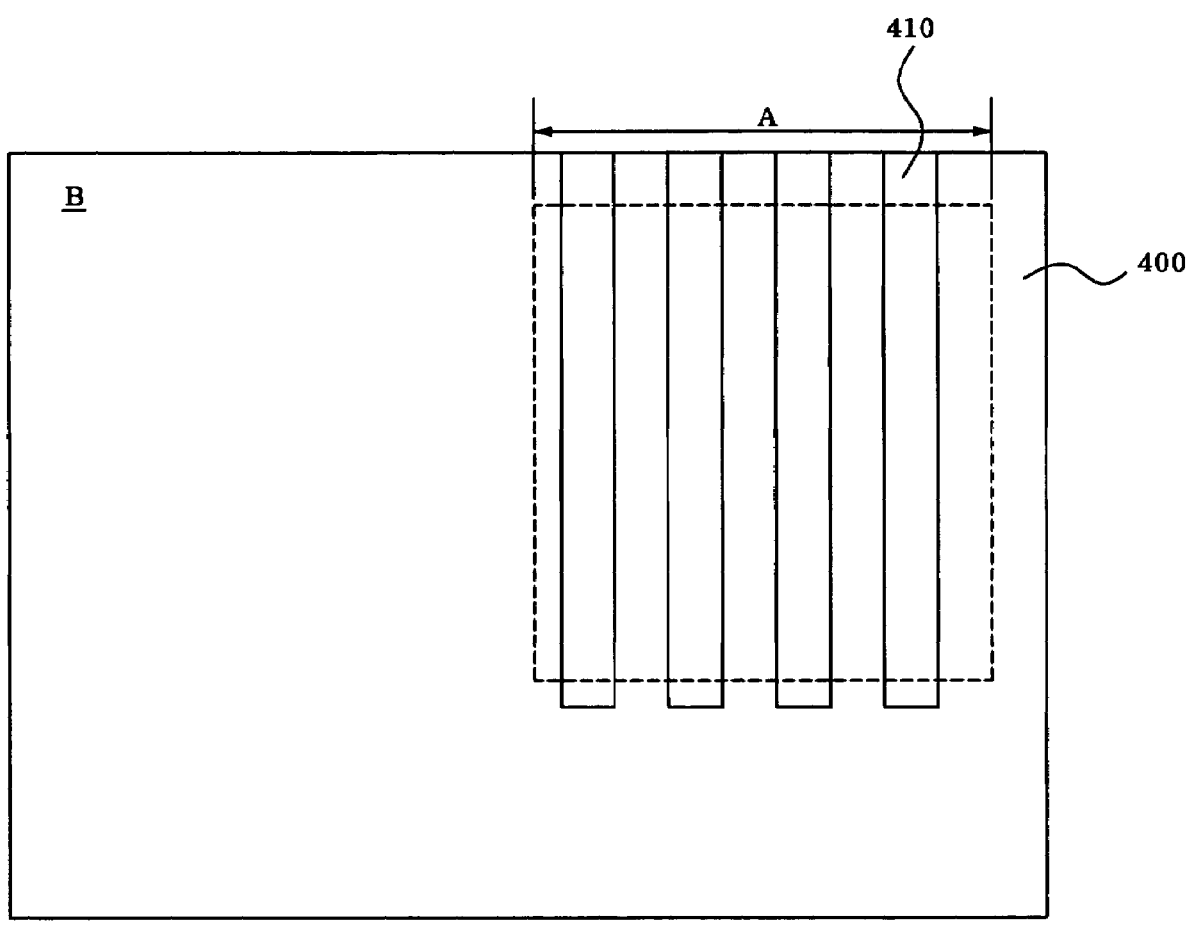
FIGS. 21 to 26 show drawings for describing a manufacturing process for an organic electroluminescence device in accordance with a fourth preferred embodiment of the present invention.

Referring to FIG. 21, first electrodes 410 are formed on a substrate 400 including a luminous portion A and a pad portion B such that they are arranged in a single direction in parallel to each other. The first electrodes 410 are formed of a transparent conductive material such as ITO or IZO.

Meanwhile, bus electrode patterns on the pad portion B, e.g., first bus electrode patterns to be connected with the first electrodes and second bus electrode patterns to be connected with second electrodes, can be formed at a time of depositing an electrode material for forming the second electrodes. Description thereof will be provided later.

Figure 22:
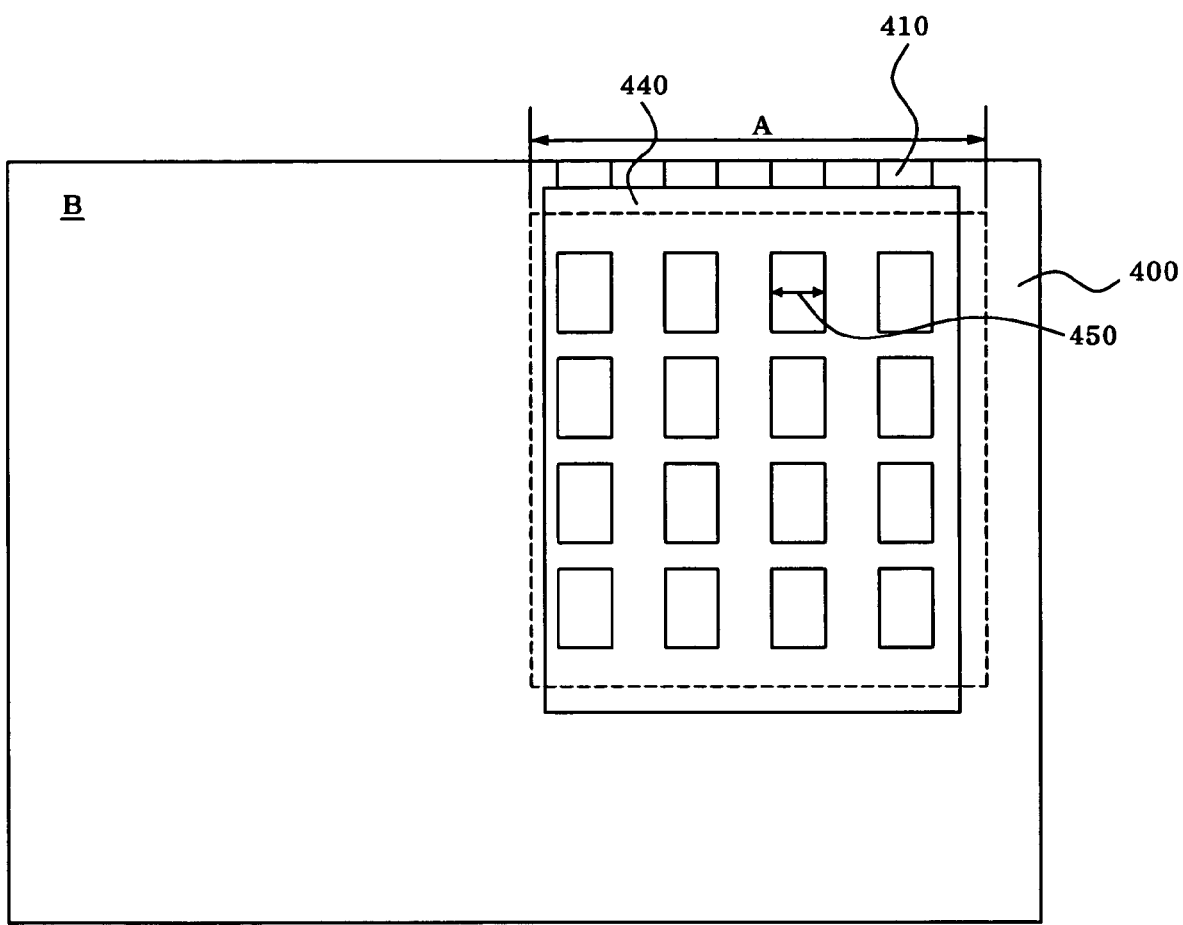

Referring to FIG. 22, an insulating layer pattern 440 of a lattice shape is formed on the first electrodes 410 disposed on the luminous portion A of the substrate 400, to thereby define pixel openings 450 on the first electrodes 410.

Figure 23:
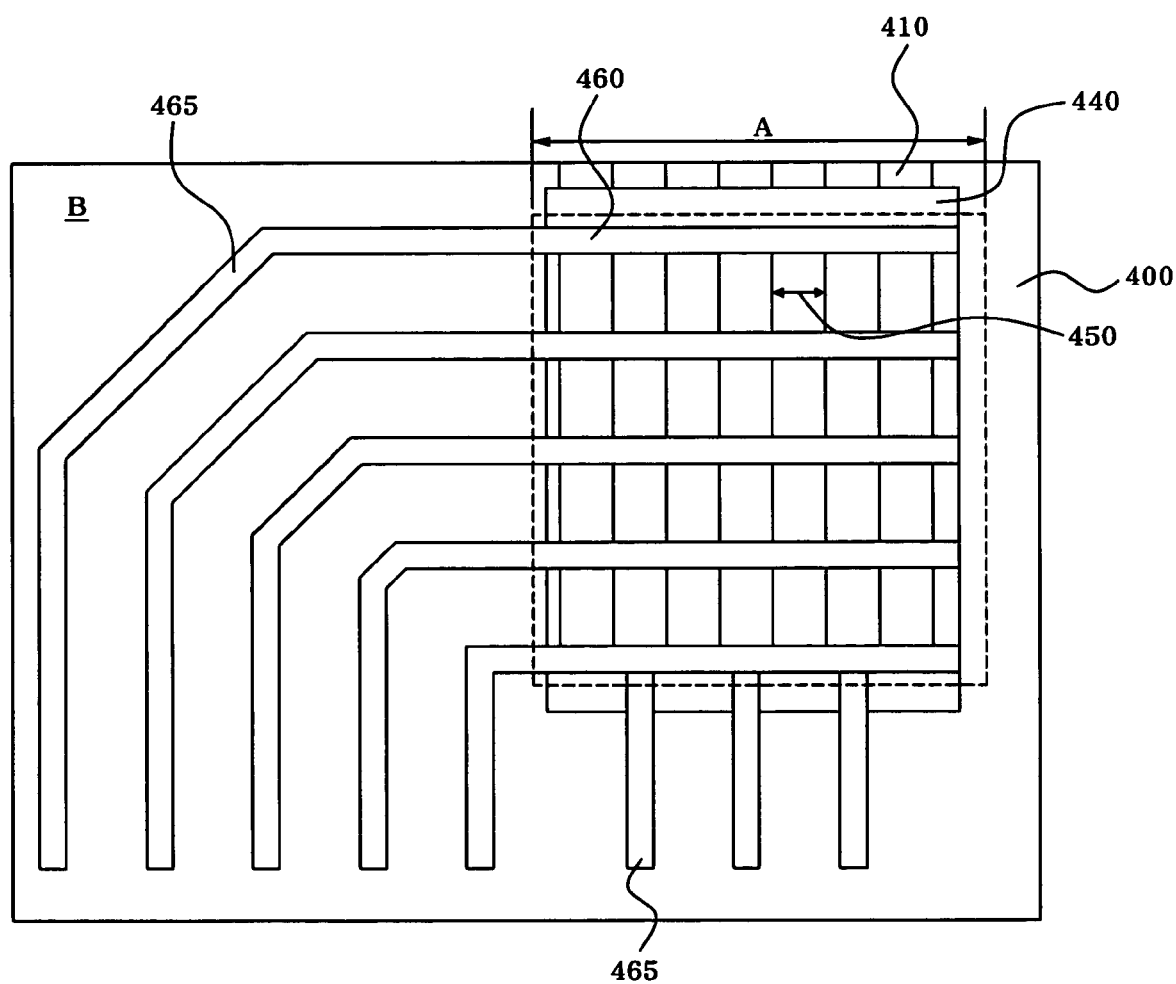

Then, referring to FIG. 23, after depositing a photo-resist film on the entire surface of the substrate 400 including the insulating layer pattern 440, an exposure and a development process are performed, so that partition layers 460 each having an adverse slope are obtained. The partition layers 460 are arranged at a preset interval such that they are parallel to each other and are perpendicular to the first electrodes 410. Further, the partition layers 460 have an overhang structure to prevent the second electrodes to be formed later from being short-circuited from neighboring elements.

While forming the partition layers 460, barrier films 465 are extended to and formed on the pad portion B, wherein the barrier films 465 serve to prevent a generation of a short-circuit between bus electrode patterns when depositing the second electrode forming material later.

Subsequently, referring to FIG. 24, an organic thin film layer 470 including an organic emission layer and the like is formed on the pixel openings. Though not shown in the drawing, the organic thin film layer 470 may be configured to have a laminated structure including a hole injecting layer, a hole transporting layer, an organic electroluminescent layer and an electron transporting layer, all of which are laminated on the pixel openings formed by the insulating layer pattern 440.

Next, as shown in FIGS. 25 and 26, the second electrodes 490 are formed on the organic thin film layer 470 in a manner such that they are perpendicular to the first electrodes 410. Each second electrode 490 may be configured as a single layer or multi layers having two or more layers formed of a metallic material including Al, Cu or Ag.

While forming the second electrodes 490 on the organic thin film layer 470, the material for forming the second electrodes 490 is also deposited on the pad portion B of the substrate 400 to thereby form the first and the second bus electrode patterns 510 and 500, respectively, on the pad portion B. The second electrode forming material is a metallic material including Al, Cu or Ag. At this time, since the areas on which the first and the second bus electrode patterns 510 and 500, respectively, are to be formed are already separated by the barrier films 465 which have been formed in advance, the deposition of the second electrode forming material can be carried out without having to use a mask.

As described, if the first and the second bus electrode patterns 510 and 500, respectively, are formed by the deposition of the second electrode forming material, e.g., Al, the resistance of the first and the second bus electrode patterns 510 and 500, respectively, can be further reduced in comparison with the case of forming them to have a laminated multi-layer structure of ITO and Cr or IZO and Cr deposited in sequence.

Thus, when driving the organic electroluminescence device by connecting it to an external driving circuit later, a power consumption and a driving voltage are reduced, resulting in improvement of the electrical characteristics of the device. Furthermore, by forming each of the first and the second bus electrode patterns as a single layer containing the second electrode forming material, a defect generation can be reduced in comparison with the case of forming the second bus electrode patterns as a laminated multi-layer structure of ITO and Cr or IZO and Cr in sequence. As a consequence, the reliability of the device can be improved.

While the invention has been shown and described with respect to the preferred embodiments, it will be understood by those skilled in the art that various changes and modifications may be made without departing from the spirit and scope of the invention as defined in the following claims.

What is claimed is:

1. An organic electroluminescence device comprising:
a substrate having a luminous portion and a pad portion;
first electrodes arranged on the luminous portion of the substrate in a single direction;
an insulating layer pattern formed on the first electrodes and the substrate in a lattice shape to define plural pixel openings on the first electrodes;
partition layers formed on the insulating layer pattern, the partition layers intersecting the first electrodes perpendicularly;
organic thin film layer formed on the pixel openings;
second electrodes formed on the organic thin film layer to be perpendicular to the first electrodes;
first bus electrode patterns formed on the pad portion of the substrate to be connected with the first electrodes;
second bus electrode patterns formed on the pad portion of the substrate to be connected with the second electrodes and containing a material for forming the second electrodes; and
barrier films formed between the second bus electrode patterns.

2. The device of claim 1, further including barrier films formed between the first bus electrode patterns.

3. The device of claim 2, wherein the barrier films formed between the second bus electrode patterns are connected with the partition layers.

4. The device of claim 1, wherein each of the first bus electrode patterns has a single layer structure formed of indium tin oxide (ITO) or indium zinc oxide (IZO); or a laminated multi-layer structure formed of ITO and chrome (Cr), or IZO and Cr.

5. The device of claim 1, wherein the second electrode forming material is a metallic material including aluminum (Al), copper (Cu) or silver (Ag) or an alloy thereof.

6. The device of claim 5, wherein each of the second bus electrode patterns has a laminated multi-layer structure formed of ITO and the second electrode forming material; or IZO and the second electrode forming material.

7. The device of claim 5, wherein each of the second bus electrode patterns has a laminated multi-layer structure formed of ITO, Cr and the second electrode forming material; or IZO, Cr and the second electrode forming material.

8. The device of claim 5, wherein each of the second bus electrode patterns has a single layer structure formed of the second electrode forming material.

* * * * *